US005739060A

United States Patent [19]
Chao

[11] Patent Number: 5,739,060
[45] Date of Patent: Apr. 14, 1998

[54] METHOD OF FABRICATING A CAPACITOR STRUCTURE FOR A SEMICONDUCTOR MEMORY DEVICE

[75] Inventor: Fang-Ching Chao, Hsinchu, Taiwan

[73] Assignee: United Microelecrtronics Corporation

[21] Appl. No.: 735,560

[22] Filed: Oct. 23, 1996

[30] Foreign Application Priority Data

Aug. 16, 1996 [TW] Taiwan ................................. 85110009

[51] Int. Cl.[6] ............................................. H01L 21/8242
[52] U.S. Cl. ........................... 438/253; 438/254; 438/396; 438/397; 148/DIG. 14
[58] Field of Search ................................... 438/239, 253, 438/254, 381, 396, 397; 148/DIG. 14

[56] References Cited

U.S. PATENT DOCUMENTS

| | | |
|---|---|---|
| 5,071,783 | 12/1991 | Taguchi et al. . |
| 5,077,688 | 12/1991 | Kumanoya et al. . |
| 5,089,869 | 2/1992 | Matsuo et al. . |
| 5,102,820 | 4/1992 | Chiba . |

(List continued on next page.)

FOREIGN PATENT DOCUMENTS

| | | |
|---|---|---|
| 0 516 031 A1 | 12/1992 | European Pat. Off. . |
| 5-21745 A | 1/1993 | Japan . |
| 5-251657 | 9/1993 | Japan . |
| 2 252 447 | 8/1992 | United Kingdom . |

OTHER PUBLICATIONS

Ema et al., "3-Dimensional Stacked Capacitor Cell for 16[M] and 64M DRAMS", International Electron Devices Meeting, pp. 592-595, Dec. 1988.

Wakamiya et al., "Novel Stacked Capacitor Cell for 64-Mb DRAM", 1989 Symposium on VLSI Technology Digest of Technical Papers, pp. 69-70.

"Mini-Trenches in Polysilicon For Dram Storage Capacitance Enhancement", IBM Technical Disclosure Bulletin, vol. 33, No. 9, Feb. 1991.

Primary Examiner—Tuan H. Nguyen
Attorney, Agent, or Firm—Rabin, Champagne, & Lynt, P.C.

[57] ABSTRACT

A method of fabricating a semiconductor memory device having a transfer transistor and a storage capacitor. First, a first insulating layer is formed on the substrate to cover the transfer transistor. Next, a first conductive layer is formed, which penetrates the first insulating layer and is electrically connected to one of the source/drain regions of the transfer transistor. A pillar-shaped layer is formed on the first conductive layer. At least first and second films are successively formed on the first conductive layer and the pillar-shaped layer. Then, the second film, the first film, and the first conductive layer are patterned to form an opening, exposing the first insulating layer. A second conductive layer is then formed on sidewalls of the opening. The pillar-shaped layer and the first film are then removed. Finally, a dielectric layer is formed on the first and second conductive layers and the second film and a third conductive layer is formed on the dielectric layer.

47 Claims, 23 Drawing Sheets

U.S. PATENT DOCUMENTS

| | | | |
|---|---|---|---|
| 5,126,810 | 6/1992 | Gotoh . | |
| 5,142,639 | 8/1992 | Kohyama et al. . | |
| 5,155,657 | 10/1992 | Oehrlein et al. . | |
| 5,158,905 | 10/1992 | Ahn . | |
| 5,164,337 | 11/1992 | Ogawa et al. | 437/47 |
| 5,172,201 | 12/1992 | Suizu . | |
| 5,196,365 | 3/1993 | Gotou . | |
| 5,206,787 | 4/1993 | Fujioka . | |
| 5,266,512 | 11/1993 | Kirsch . | |
| 5,274,258 | 12/1993 | Ahn . | |
| 5,338,955 | 8/1994 | Tamura et al. . | |
| 5,354,704 | 10/1994 | Yang et al. . | |
| 5,371,701 | 12/1994 | Lee et al. . | |
| 5,389,568 | 2/1995 | Yun . | |
| 5,399,518 | 3/1995 | Sim et al. . | |
| 5,438,011 | 8/1995 | Blalock et al. | 437/919 |
| 5,443,993 | 8/1995 | Park et al. | 437/47 |
| 5,453,633 | 9/1995 | Yun . | |
| 5,460,996 | 10/1995 | Ryou . | |
| 5,478,768 | 12/1995 | Iwasa . | |
| 5,478,770 | 12/1995 | Kim | 437/60 |
| 5,482,886 | 1/1996 | Park et al. . | |
| 5,508,222 | 4/1996 | Sakao | 437/919 |
| 5,521,419 | 5/1996 | Wakamiya et al. . | |
| 5,523,542 | 6/1996 | Chen et al. . | |
| 5,543,346 | 8/1996 | Keum et al. . | |
| 5,550,080 | 8/1996 | Kim | 437/47 |
| 5,561,309 | 10/1996 | Cho et al. . | |
| 5,561,310 | 10/1996 | Woo et al. . | |
| 5,572,053 | 11/1996 | Ema . | |
| 5,595,931 | 1/1997 | Kim | 437/47 |

METHOD OF FABRICATING A CAPACITOR STRUCTURE FOR A SEMICONDUCTOR MEMORY DEVICE

BACKGROUND OF THE INVENTION

1. Field of the Invention

The invention relates in general to semiconductor memory devices, and more particularly to a method of fabricating a dynamic random access memory (DRAM) cell substantially composed of a transfer transistor and a charge storage capacitor.

2. Description of the Related Art

FIG. 1 is a circuit diagram of a memory cell for a DRAM device. As shown in the drawing, a DRAM cell is substantially composed of a transfer transistor T and a charge storage capacitor C. A source of the transfer transistor T is connected to a corresponding bit line BL, and a drain thereof is connected to a storage electrode 6 of the charge storage capacitor C. A gate of the transfer transistor T is connected to a corresponding word line WL. An opposing electrode 8 of the capacitor C is connected to a constant power source. A dielectric film 7 is provided between the storage electrode 6 and the opposing electrode 8.

In the DRAM manufacturing process, a two-dimensional capacitor called a planar type capacitor is mainly used for a conventional DRAM having a storage capacity less than 1M (mega=million) bits. In the case of a DRAM having a memory cell using a planar type capacitor, electric charges are stored on the main surface of a semiconductor substrate, so the main surface is required to have a large area. This type of a memory cell is therefore not suitable for a DRAM having a high degree of integration. For a high integration DRAM, such as a DRAM with more than 4M bits of memory, a three-dimensional capacitor, called a stacked-type or a trench-type capacitor, has been introduced.

With stacked-type or trench-type capacitors, it has been made possible to obtain a larger memory in a similar volume. However, to realize a semiconductor device of an even higher degree of integration, such as a very-large-scale integration (VLSI) circuit having a capacity of 64M bits, a capacitor of such a simple three-dimensional structure as the conventional stacked-type or trench-type, turns out to be insufficient.

One solution for improving the capacitance of a capacitor is to use the so-called fin-type stacked capacitor, which is proposed by Ema et al., in "3-Dimensional Stacked Capacitor Cell for 16M and 64M DRAMs", International Electron Devices Meeting, pp. 592–595, December 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.); 5,126,810 (Gotou); 5,196,365 (Gotou); and 5,206,787 (Fujioka).

Another solution for improving the capacitance of a capacitor is to use the so-called cylindrical-type stacked capacitor, which is proposed by Wakamiya et at., in "Novel Stacked Capacitor Cell for 64-Mb DRAM", 1989 Symposium on VLSI Technology Digest of Technical Papers, pp. 69–70. The cylindrical-type stacked capacitor includes electrodes and dielectric films which extend in a cylindrical shape to increase the surface areas of the electrodes. A DRAM having the cylindrical-type stacked capacitor also is disclosed in U.S. Pat. No. 5,077,688 (Kumanoya et al.).

With the trend toward increased integration density, the size of the DRAM cell in a plane (the area it occupies in a plane) must be further reduced. Generally, a reduction in the size of the cell leads to a reduction in charge storage capacity (capacitance). Additionally, as the capacitance is reduced, the likelihood of soft errors arising from the incidence of α-rays is increased. Therefore, there is still a need in this art to design a new structure of a storage capacitor which can achieve the same capacitance, while occupying a smaller area in a plane, and a suitable method of fabricating the structure.

SUMMARY OF THE INVENTION

It is therefore an object of the invention to provide a method of fabricating a tree-type capacitor structure for a semiconductor memory device, that allows an increased area for charge storage.

In accordance with the foregoing and other objects of the invention, a new and improved method of fabricating a semiconductor memory device is provided.

A semiconductor memory device according to the invention includes a substrate, a transfer transistor formed on the substrate, the transfer transistor having source/drain regions, and a storage capacitor electrically connected to one of the source/drain regions. The method of fabricating the storage capacitor includes forming a first insulating layer to cover the transfer transistor on the substrate, forming a first conductive layer which penetrates the first insulating layer and is electrically connected to one of the source/drain regions, forming a pillar-shaped layer on the first conductive layer, forming a second conductive layer on the surface of the pillar-shaped layer and the first conductive layer, patterning the second conductive layer to remove a portion of the second conductive layer on the pillar-shaped layer, patterning the second conductive layer and the first conductive layer to form an opening exposing the first insulating layer, and forming a third conductive layer in the shape of a hollow cylinder connected to an edge of the first conductive layer at a periphery of the opening. The third conductive layer and the first conductive layer form a trunk-like conductive layer. One end of the second conductive layer is connected to the inner surface of the third conductive layer, forming a branch-like conductive layer. The first, second, and third conductive layers form a storage electrode of the storage capacitor. The method of fabricating the storage capacitor further includes removing the pillar-shaped layer, forming a dielectric layer on the exposed surfaces of the first, second, and third conductive layers, and forming a fourth conductive layer on the dielectric layer to form an opposing electrode of the storage capacitor.

In accordance with one of the preferred embodiments of the invention, the trunk-like conductive layer includes a lower trunk-like portion electrically connected to one of the source/drain regions, and an upper trunk-like portion extending substantially upright from an edge of the lower trunk-like portion. The method of the invention can further include a step of forming an etching protection layer on the first insulating layer just after the first insulating layer is formed. In a preferred embodiment, the step of patterning the second conductive layer includes etching a portion of the second conductive layer over the pillar-shaped layer. In another preferred embodiment, the step of patterning the second conductive layer includes polishing a portion of the second conductive layer over the pillar-shaped layer using a chemical mechanical polish technique.

In accordance with another preferred embodiment of the invention, the step of forming a pillar-shaped layer on the first conductive layer includes forming a thick insulating layer on the first conductive layer, forming a photoresist on the thick insulating layer over the source/drain region, etching a portion of the uncovered thick insulating layer, performing photoresist erosion to expose a portion of the thick insulating layer, etching a part of the exposed thick insulating layer until the first conductive layer is exposed, to form a pillar-shaped layer with a stair case shape, and removing the photoresist.

In accordance with another preferred embodiment of the invention, just after the first insulating layer is formed on the substrate, an etching protection layer is formed on the first insulating layer, and a fourth insulating layer is formed on the etching protection layer. The first conductive layer is formed to penetrate the fourth insulating layer and the etching protection layer. The fourth insulating layer is removed with the pillar-shaped layer.

According to another aspect of the invention, a method of fabricating a semiconductor memory device includes forming a first insulating layer to cover a transfer transistor on a substrate, forming a first conductive layer which penetrates at least the first insulating layer and is electrically connected to one of the source/drain regions, and forming a pillar-shaped layer on the first conductive layer. On the surface of the pillar-shaped layer and the first conductive layer, at least one first film and one second film are alternately formed. The second film is made of conductive material, and the first film is made of insulating material. The second film is patterned to remove the portion of the second film over the pillar-shaped layer. The second film is patterned with the first film and the first conductive layer to form an opening exposing the first insulating layer. A second conductive layer is formed as a hollow cylinder connected to an edge of the first conductive layer at a periphery of the opening. The second conductive layer and the first conductive layer form a trunk-like conductive layer. One end of the second conductive layer is connected to an inner surface of the second conductive layer, to form a branch-like conductive layer. The first conductive layer, the second film, and the second conductive layer form a storage electrode of the storage capacitor. The method further includes removing the pillar-shaped layer and the first film, forming a dielectric layer on exposed surfaces of the first conductive layer, the second film, and the second conductive layer, and forming a third conductive layer on the dielectric layer to form an opposing electrode of the storage capacitor.

According to another aspect of the invention, a method of fabricating a semiconductor memory device includes forming a first insulating layer to cover a transfer transistor on a substrate, forming a first conductive layer which penetrates at least the first insulating layer and is electrically connected to one of the source/drain regions of the transfer transistor, forming at least one pillar-shaped layer on the first conductive layer, forming a second conductive layer on sidewalls of the pillar-shaped layer, patterning the first conductive layer to form an opening exposing the first insulating layer, and forming a third conductive layer in the shape of a hollow cylinder connected to an edge of the first conductive layer at a periphery of the opening. One end of the second conductive layer is connected to an upper surface of the first conductive layer, to form a branch-like conductive layer. The first, second, and third conductive layers form a storage electrode of the storage capacitor. The method further includes removing the pillar-shaped layer, forming a dielectric layer on the exposed surfaces of the first, second, and third conductive layers, and forming a fourth conductive layer on the dielectric layer to form an opposing electrode of the storage capacitor.

According to another aspect of the invention, a method of fabricating a semiconductor memory device with a storage capacitor includes forming a first insulating layer to cover a transfer transistor on a substrate, forming a first conductive layer which penetrates at least the first insulating layer and is electrically connected to one of the source/drain regions of the transfer transistor, forming at least one pillar-shaped layer on the first conductive layer, and forming a second conductive layer on the sidewalls of the pillar-shaped layer. One end of the second conductive layer is connected to an upper surface of the first conductive layer. The method further includes forming at least a first film and the second film alternately on the surface of the second conductive layer and the pillar-shaped layer and on the first conductive layer. The second film is made of a conductive material and the first is made of an insulating material. The method further includes patterning the second film to remove the portion of the second conductive layer over the pillar-shaped layer, patterning the second film, the first film and the first conductive layer to form an opening exposing the first insulating layer, and forming a third conductive layer shaped as a hollow cylinder connected to an edge of the first conductive layer at a periphery of the opening. The third conductive layer and the first conductive layer form a trunk-like conductive layer. One end of the second film is connected to an inner surface of the third conductive layer. The second film and the second conductive layer form a branch-like conductive layer. The first, second, and third conductive layers and the second film form a storage electrode of the storage capacitor. The method further includes removing the pillar-shaped layer and the first film, forming a dielectric layer on the exposed surfaces of the first, second, and third conductive layers, and forming a fourth conductive layer on the dielectric layer to form an opposing electrode of the storage capacitor.

According to another aspect of the invention, a method for fabricating a semiconductor memory device with a storage capacitor includes forming a first insulating layer to cover a transfer transistor on a substrate, and forming a trunk-like conductive layer. The trunk-like conductive layer includes a lower trunk-like portion electrically connected to one of the source/drain regions of the transfer transistor, and an upper trunk-like portion extending substantially upright from an edge of the lower trunk-like portion. The method further includes forming at least a branch-like conductive layer, which includes at least a first extended segment and a second extended segment. An end of the first extended segment is connected to an inner surface of the trunk-like conductive layer, and the second extended segment extends from another end of the first extended segment. The trunk-like conductive layer and the branch-like conductive layer form a storage electrode of the storage capacitor. The method further includes forming a dielectric layer on the exposed surface of the trunk-like conductive layer and the branch-like conductive layer, and forming an upper conductive layer on the dielectric layer to form an opposing electrode of the storage capacitor.

According to another method of the invention, a method of fabricating a semiconductor memory device with a capacitor includes forming an insulating layer to cover a transfer transistor on a substrate, and forming a trunk-like conductive layer, which includes a lower trunk-like portion electrically connected to one of the source/drain regions of the transfer transistor, and an upper trunk-like portion extending substantially upright from an edge of the lower trunk-like portion. The method further includes forming at least a branch-like conductive layer, which is shaped as a substantially hollow cylinder. One end of the branch-like conductive layer is connected to an upper surface of the trunk-like conductive layer and extends substantially upright. The trunk-like conductive layer and the branch-like conductive layer form a storage electrode of the storage capacitor. The method further includes forming a dielectric layer on exposed surfaces of the trunk-like conductive layer and the branch-like conductive layer, and forming an upper conductive layer on the dielectric layer to form an opposing electrode of the storage capacitor.

According to another aspect of the invention, a method of fabricating a semiconductor memory device with a capacitor includes forming an insulating layer to cover a transfer transistor on a substrate, and forming a trunk-like conductive layer, which includes a lower trunk-like portion electrically connected to one of the source/drain regions of the transfer transistor, and an upper trunk-like portion extending substantially upright from an edge of the lower trunk-like portion. The method further includes forming a branch-like conductive layer, which is substantially shaped as a hollow cylinder. One end of the branch-like conductive layer is connected to the upper surface of the trunk-like conductive layer and extends substantially upright. The method further includes forming at least a second branch-like conductive layer. One end of the second branch-like conductive layer is connected to the inner surface of the trunk-like conductive layer. The second branch-like conductive layer has an outwardly extended portion extending outwardly from the end. The trunk-like conductive layer and the branch-like conductive layer form a storage electrode of the storage capacitor. The method further includes forming a dielectric layer on exposed surfaces of the trunk-like conductive layer and the branch-like conductive layer, and forming an upper conductive layer on the dielectric layer to form an opposing electrode of the storage capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

First Preferred Embodiment

A process for fabricating a first preferred embodiment of the invention, relating to a semiconductor memory device with a tree-type storage capacitor, is described in detail with reference to FIG. 2A through FIG. 2H.

Figure 1:
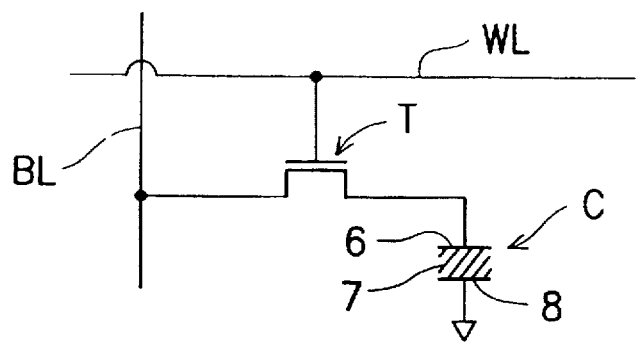
FIG. 1 is a circuit diagram of a memory cell of a DRAM device.
Figure 2A:
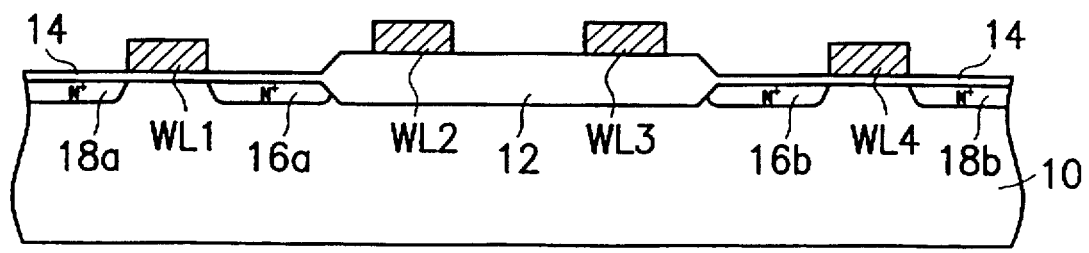
FIGS. 2A through 2H are cross-sectional views depicting process steps for fabricating a first embodiment of a semiconductor memory cell having a tree-type capacitor according to the invention.

Referring to FIG. 2A, the surface of a silicon substrate 10 is first thermally oxidized by, for example, a local oxidation of silicon (LOCOS) technique. Therefore, a field oxide layer 12 with a thickness of about 3000 angstroms is formed on the surface of the silicon substrate 10. Next, a thermal oxidation processing is again performed, to form a gate oxide layer 14 with a thickness of about 150 angstroms on the surface of the silicon substrate 10. Then, by using chemical vapor deposition (CVD) technique or low pressure chemical vapor deposition (LPCVD), a polysilicon layer with a thickness of about 2000 angstroms is deposited over all the surface of the silicon substrate 10. To improve the conductivity of the polysilicon layer, phosphorus ions can be implanted into the polysilicon layer. Preferably, a refractory metal layer is deposited and an annealing process is performed to form a polycide layer. Consequently, the conductivity is further enhanced. The refractory metal can be, for example, tungsten, deposited to a thickness of 2000 angstroms. Thereafter, a conventional photolithography and etching technique is performed in order to pattern the polycide layer. Therefore, gates WL1 to WL4 (or word lines WL1 to WL4) are formed as shown in FIG. 2A. Next, arsenic ions are implanted into the substrate 10 to form drain regions 16a, 16b, and source regions 18a, 18b. During this implantation step, the word lines WL1 to WL4 are used as mask layers and the ions are implanted with a dosage of about 1015 atoms/cm2 at an energy level of about 70 KeV.

Figure 2B:
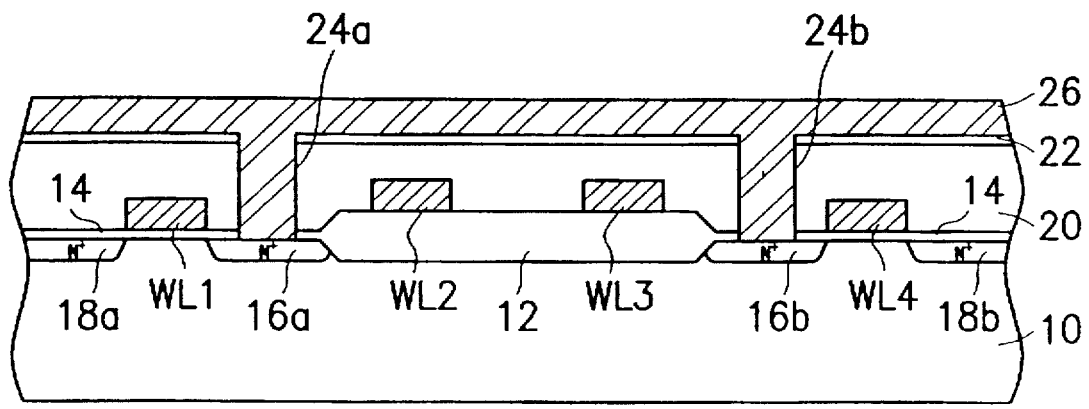

Referring next to FIG. 2B, a planarized insulating layer 20, such as borophosphosilicate glass (BPSG) with a thickness of about 7000 angstroms, is deposited by CVD. Then, an etching protection layer 22, such as a silicon nitride layer with a thickness of about 1000 angstroms, is also formed by CVD. Thereafter, using conventional photolithography and etching techniques, the etching protection layer 22, the planarized insulating layer 20, and the gate oxide layer 14 are etched in succession. Contact holes 24a, 24b for storage electrodes are therefore formed on the top surface of the etching protection layer 22, extending to the surface of the drain regions 16a, 16b. Next, a polysilicon layer 26 is deposited. Preferably, arsenic ions can be implanted into the polysilicon layer 26 to increase the conductivity. As shown in FIG. 2B, the polysilicon layer 26 completely fills the contact holes 24a, 24b and also overlays the surface of the etching protection layer 22.

Figure 2C:
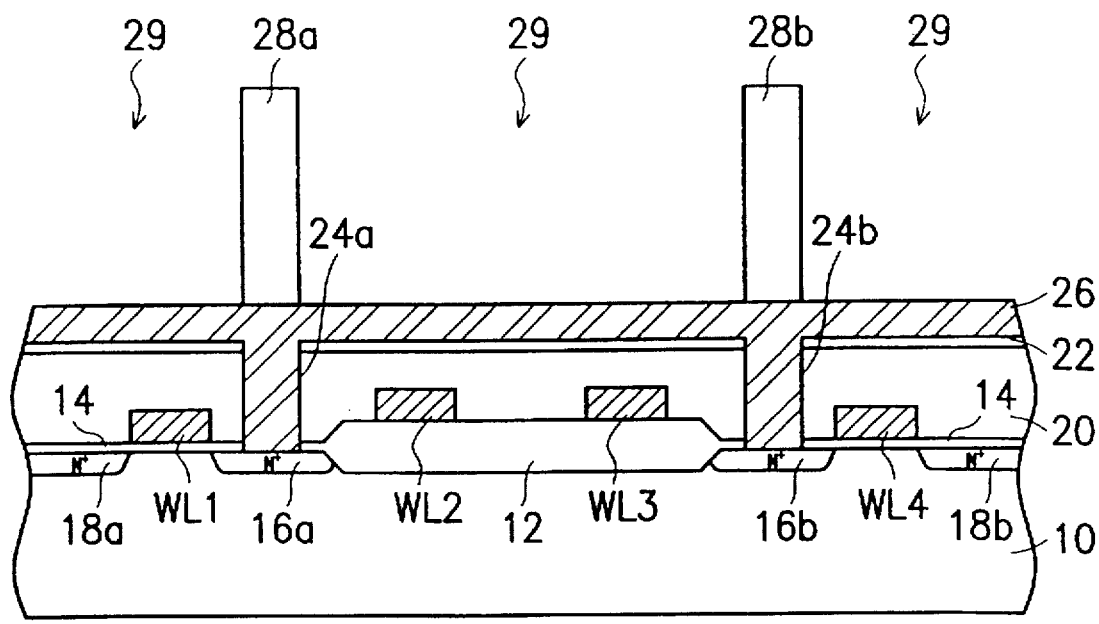

Referring to FIG. 2C, a thick insulating layer, such as a silicon dioxide layer with a thickness of about 7000 angstroms, is subsequently deposited over the polysilicon layer 26. Conventional photolithography and etching techniques are performed to pattern the insulating layer, such that insulating pillars 28a, 28b are formed as shown in FIG. 2C. The insulating pillars 28a, 28b are preferably located above the drain regions 16a and 16b, respectively, on the polysilicon layer 26. Gaps 29 are thus formed between the insulating pillars 28a, 28b.

Figure 2D:
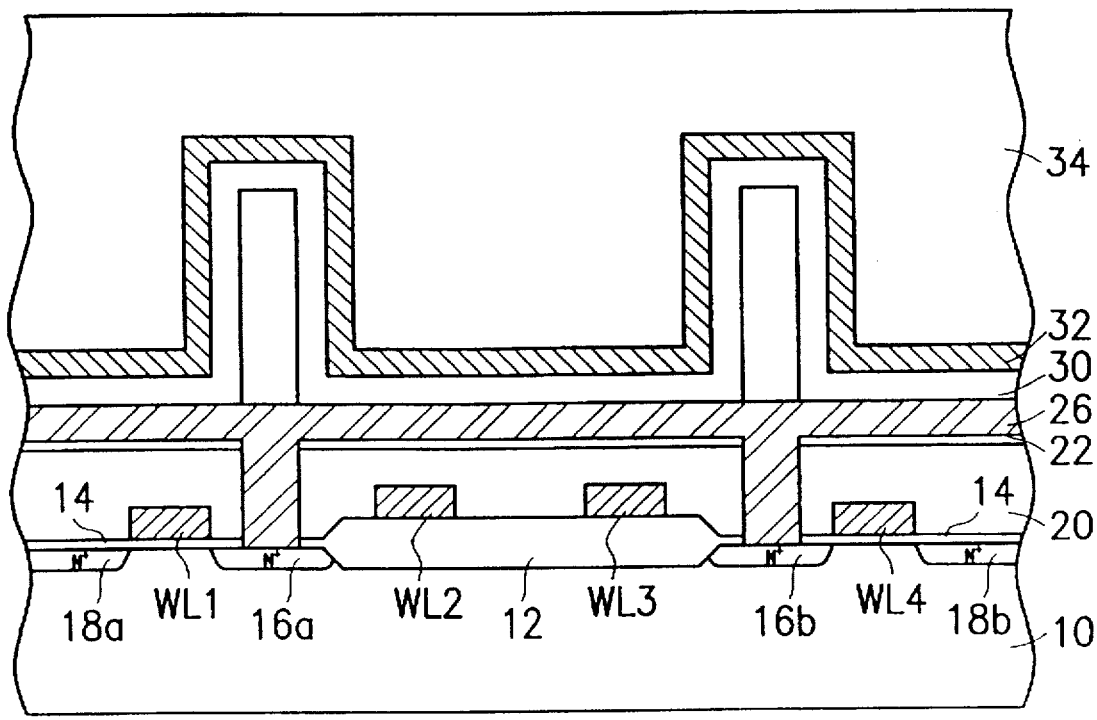

Referring to FIG. 2D, by CVD, an insulating layer 30, a polysilicon layer 32, and an insulating layer 34 are formed in succession. The insulating layers 30 and 34 can be, for example, silicon dioxide. The thickness of each of the insulating layer 30 and the polysilicon layer 32 can be, for example, about 1000 angstroms. The thickness of the insulating layer 34 is preferably such that it is able to at least fully fill the gaps 29 between the insulating pillars 28a and 28b. In accordance with the first preferred embodiment, the thickness of the insulating layer 34 is about 7000 angstroms. In order to increase the conductivity of the polysilicon layer 32, arsenic ions may be implanted into the polysilicon layer 32.

Figure 2E:
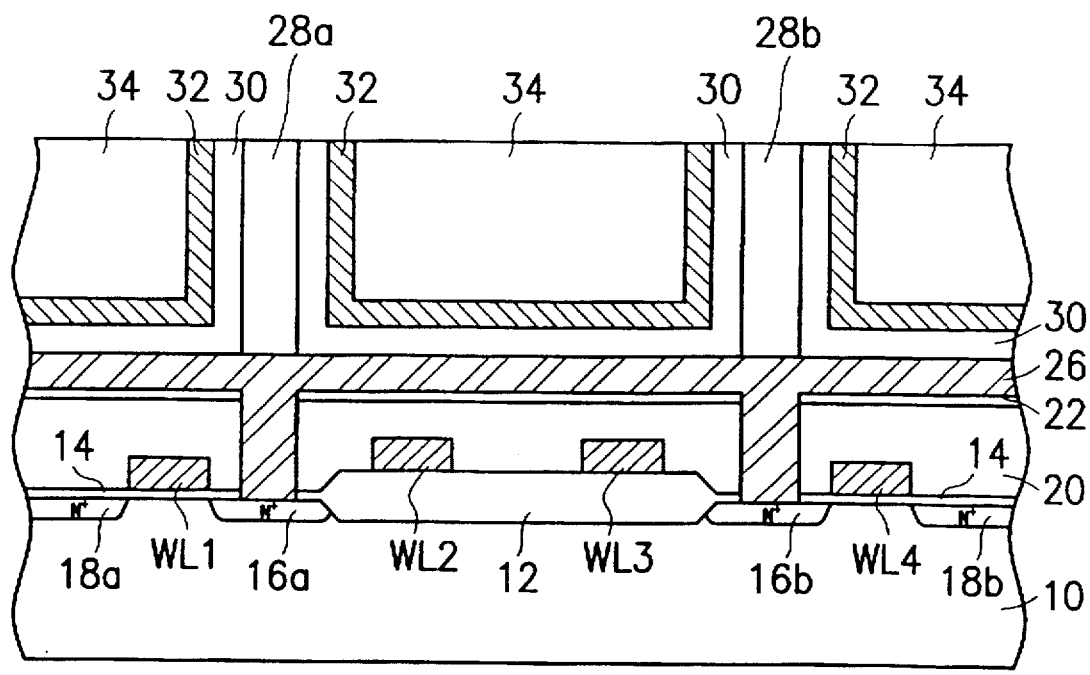

Referring to FIG. 2E, the surface of the structure as shown in FIG. 2D is polished by a chemical mechanical polish (CMP) technique until at least the top of the insulating pillars 28a, 28b are exposed.

Figure 2F:
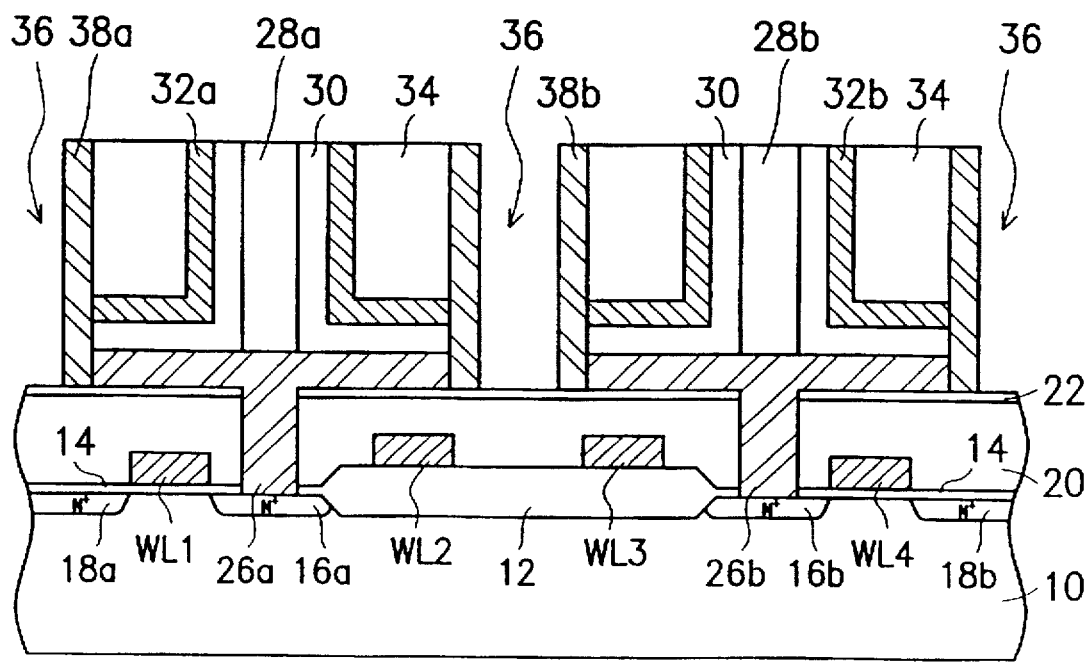

Referring to FIG. 2F, using conventional photolithography and etching techniques, the insulating layer 34, the polysilicon layer 32, the insulating layer 30, and the polysilicon layer 26 are etched to form an opening 36; the storage electrode of the storage capacitor for each memory cell is now defined by the placement of the conductive layers. Also by the above-mentioned etching step, the polysilicon layers 32 and 26 are divided into segments 32a, 32b, and 26a, 26b, respectively. Then, polysilicon spacers 38a, 38b are formed on the sidewalls of the openings 36. In accordance with the first preferred embodiment, the polysilicon spacers 38a, 38b may be formed by forming a polysilicon layer with a thickness of about 1000 angstroms and etching back the polysilicon layer to form the spacers 38a, 38b. Arsenic ions can be implanted into the polysilicon layer to increase the conductivity of the polysilicon spacers 38a, 38b.

Figure 2G:
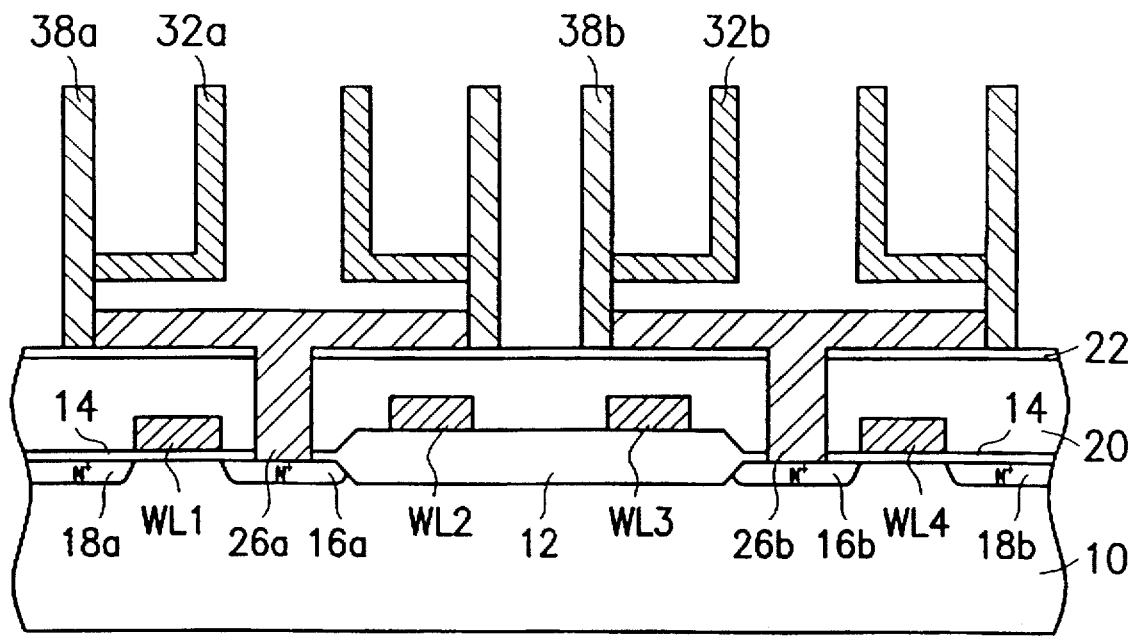

Referring to FIG. 2G, wet etching is performed by using the etching protection layer 22 as an etch end point to remove the exposed silicon dioxide layers, which are the insulating layers 34, 30, and the insulating pillars 28a, 28b. After the wet etching step, the storage electrode of the DRAM storage capacitor is complete. The storage electrode shown in FIG. 2G includes the lower trunk-like polysilicon layers 26a, 26b, the upper trunk-like polysilicon layers 38a, 38b, and the branch-like polysilicon layers 32a, 32b, which are substantially L-shaped in cross section. The lower trunk-like polysilicon layers 26a, 26b directly contact the drain regions 16a, 16b of the transfer transistor, respectively. The cross sections of the lower polysilicon layers 26a, 26b are T-shaped. The upper trunk-like polysilicon layers 38a, 38b connect to the edges of the lower trunk-like polysilicon layers 26a, 26b, respectively, and stand substantially vertically, that is, normal to the surface of the etching protection layer 22. The upper trunk-like polysilicon layers 38a, 38b form hollow cylinders, and the cross sections of which can be circular or rectangular. The branch-like polysilicon layers 32a, 32b connect to the inner surfaces of the upper polysilicon layers 38a, 38b, respectively, and first extend horizontally inward, that is, toward the drain regions, for a determined distance and then extend vertically upright. The term "tree-type storage electrode" refers herein to the complete storage electrode according to the invention, since its structure is unusual. The capacitor including the "tree-type storage electrode" is therefore called the "tree-type storage capacitor".

Figure 2H:
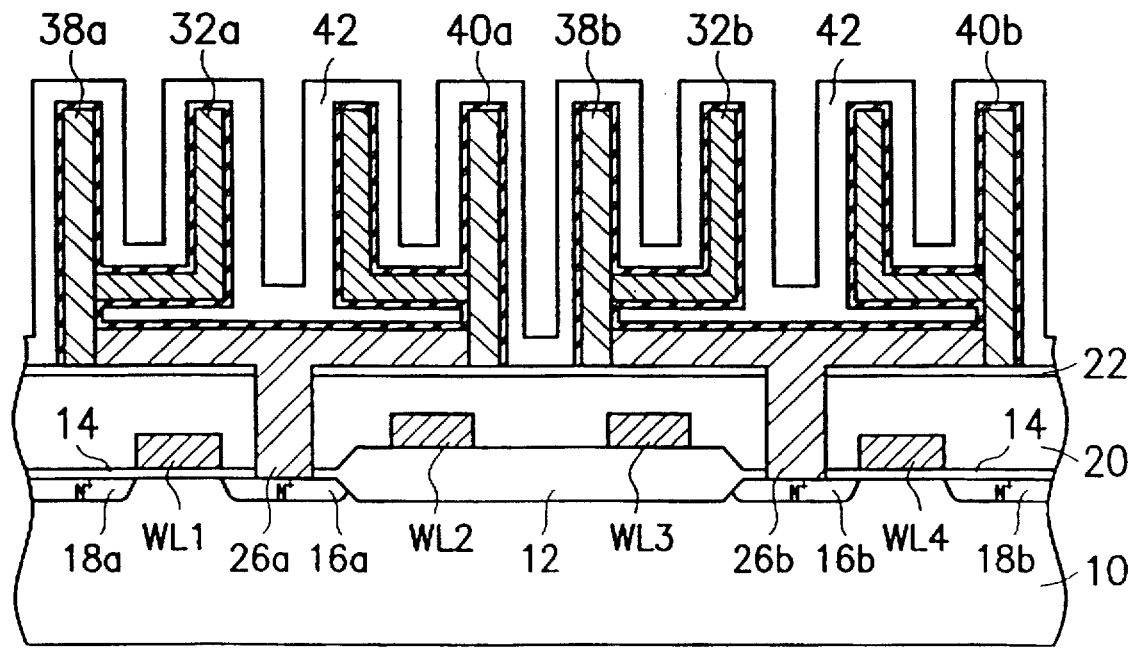

Referring to FIG. 2H, dielectric films 40a, 40b are formed on the surface of the storage electrodes (26a, 32a, 38a) and (26b, 32b, 38b), respectively. Each dielectric film 40a, 40b may be, for example, a silicon dioxide layer, a silicon nitride layer, an NO structure (silicon nitride/silicon dioxide), or an ONO structure (silicon dioxide/silicon nitride/silicon dioxide). Then, opposing electrodes 42 made of polysilicon are formed on the surface of the dielectric films 40a, 40b. The opposing electrodes are fabricated by forming a polysilicon layer with a thickness of, for example, 1000 angstroms, by CVD, doping the polysilicon layer with, for example, an N-type dopant to increase the conductivity, and patterning the polysilicon layer using conventional photolithography and etching techniques. The storage capacitor of the DRAM cell is then complete.

Though it is not shown in FIG. 2H, it is clear to persons skilled in the art that word lines, bonding pads, interconnections, passivations, and packages may be fabricated according to conventional processes to complete the DRAM IC. Because these conventional processes are not related to characteristics of the invention, is not necessary to describe these processes in detail.

In the first embodiment, the lowest polysilicon layer 26 is divided into lower trunk-like polysilicon layers 26a, 26b for each memory cell, as shown in FIG. 2F. However, in accordance with another preferred embodiment of the invention, the polysilicon layer 26 may be patterned to be lower trunk-like polysilicon layers 26a, 26b for each memory cell just after the polysilicon layer 26 is deposited, as shown in FIG. 2B. The further processes are then performed similarly as described above.

Second Preferred Embodiment

In the first embodiment, each storage electrode includes only one branch-like electrode layer that is substantially L-shaped in cross section. However, the invention is not limited in scope to this particular embodiment. The number of substantially L-shaped branch-like electrodes can be two, three, or more. A storage electrode with two branch-like electrode layers substantially L-shaped is described, as the second preferred embodiment.

A process for fabricating the second preferred embodiment of the invention, relating to a semiconductor memory device with a tree-type storage capacitor, is described in detail with reference to FIG. 3A through FIG. 3E.

The tree-type storage capacitor of the second embodiment is based on the wafer structure of FIG. 2C. Elements in FIGS. 3A through 3E that are identical to those in FIG. 2C are labeled with the same reference numerals.

Figure 3A:
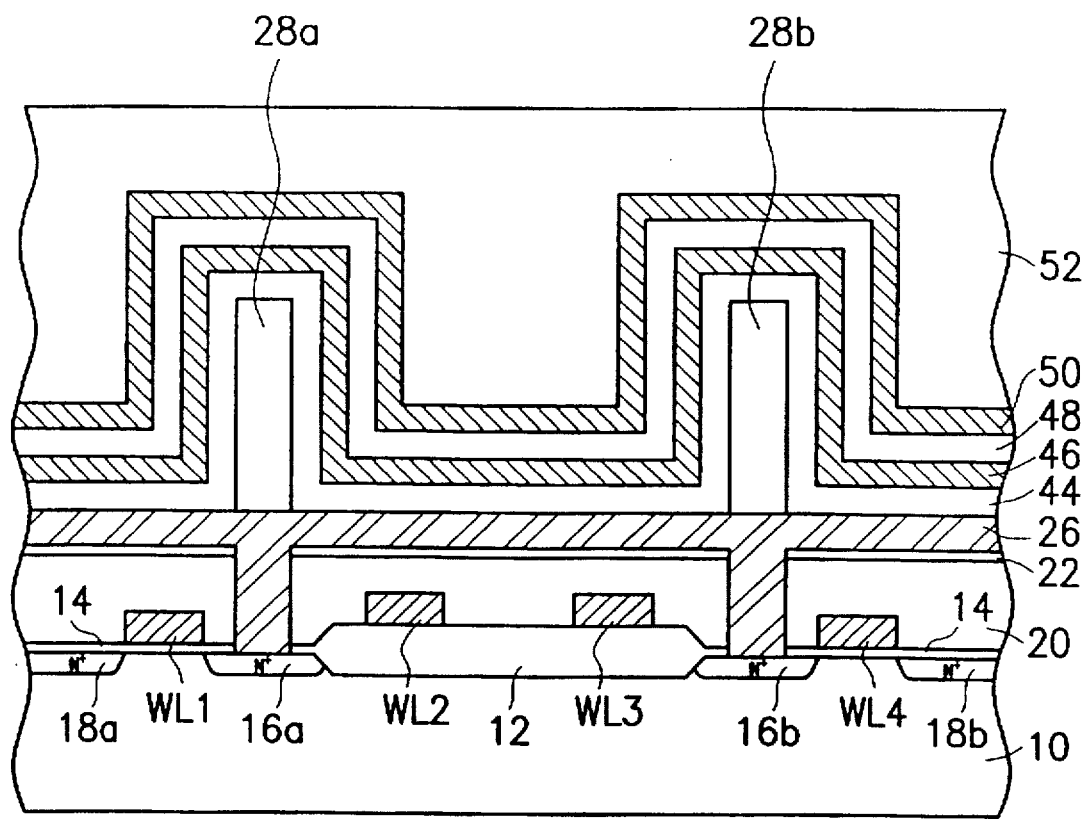
FIGS. 3A through 3E are cross-sectional views depicting process steps for fabricating a second embodiment of a semiconductor memory cell having a tree-type capacitor according to the invention.

Referring to FIGS. 2C and 3A, CVD is performed to alternately form insulating layers and polysilicon layers, in particular, an insulating layer 44, a polysilicon layer 46, an insulating layer 48, a polysilicon layer 50, and an insulating layer 52 in succession, as shown in FIG. 3A. The insulating layers 44, 48, and 52 can be, for example, silicon dioxide. The thickness of the insulating layers 44, 48, and the polysilicon layers 46, 50 can be, for example, 1000 angstroms. The thickness of the insulating layer 52 can be, for example, 7000 angstroms and preferably fills the gaps 29 between the insulating pillars 28a, 28b. To improve the conductivity of the polysilicon layers, ions such as arsenic can be implanted into the polysilicon layers.

Figure 3B:
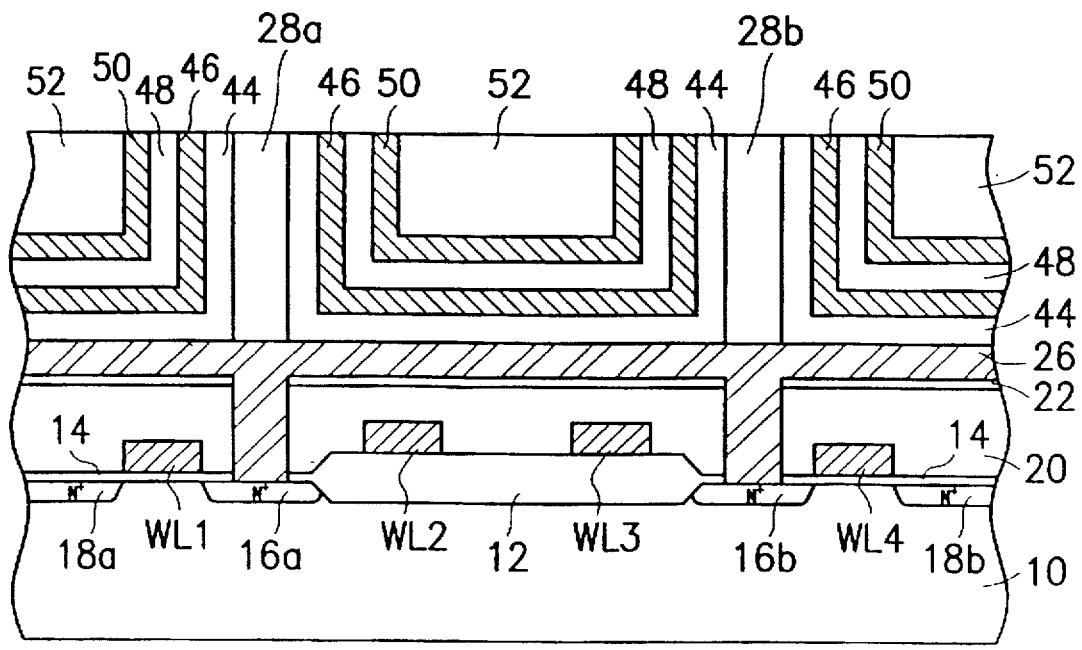

Referring to FIG. 3B, a CMP technique can be utilized to polish the surface of the structure shown in FIG. 3A until at least the tops of the insulating pillars 28a, 28b are exposed.

Figure 3C:
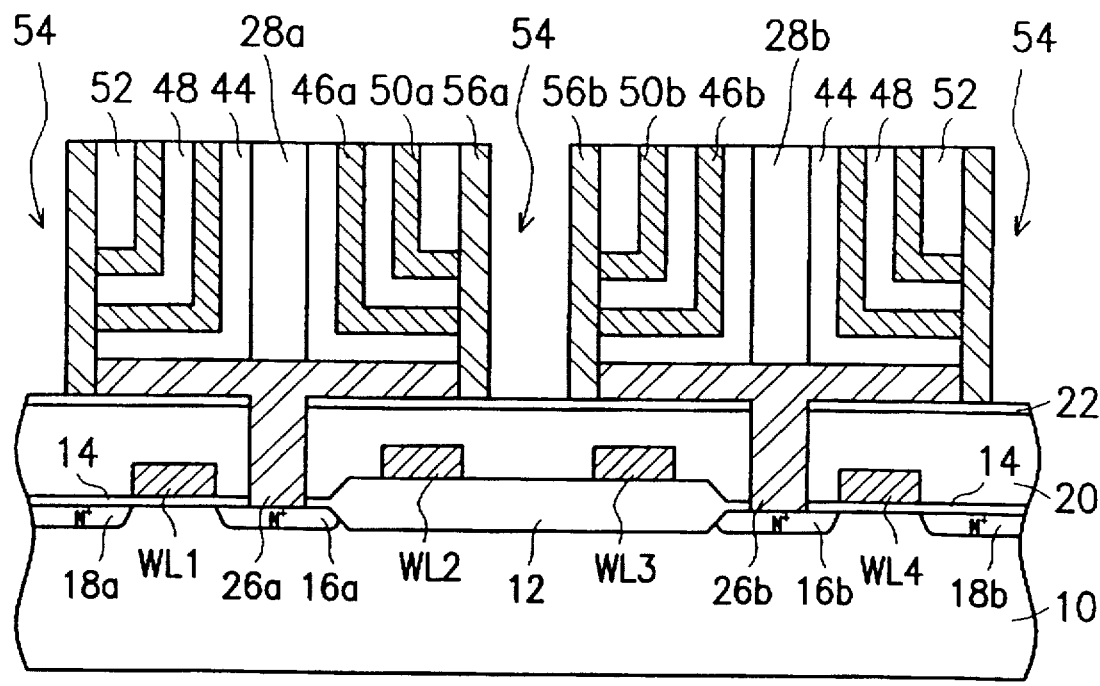

Referring to FIG. 3C, conventional photolithography and etching techniques are utilized to etch the insulating layer 52, the polysilicon layer 50, the insulating layer 48, the polysilicon layer 46, the insulating layer 44, and the polysilicon layer 26 in succession; thus, an opening 54 is formed and the storage electrode of the storage capacitor for each memory cell is patterned. Also by the above-mentioned etching step, the polysilicon layers 50, 46, and 26 are divided into segments 50a, 50b, 46a, 46b and 26a, 26b, respectively. Then, polysilicon spacers 56a, 56b are formed on the sidewalls of the opening 54. In according with the second preferred embodiment, the polysilicon spacers 56a, 56b may be formed by forming a polysilicon layer with a thickness of about 1000 angstroms and etching back the polysilicon layer to form spacers 56a, 56b. Arsenic ions can be implanted into the polysilicon layer to increase the conductivity of the polysilicon spacers 56a, 56b.

Figure 3D:
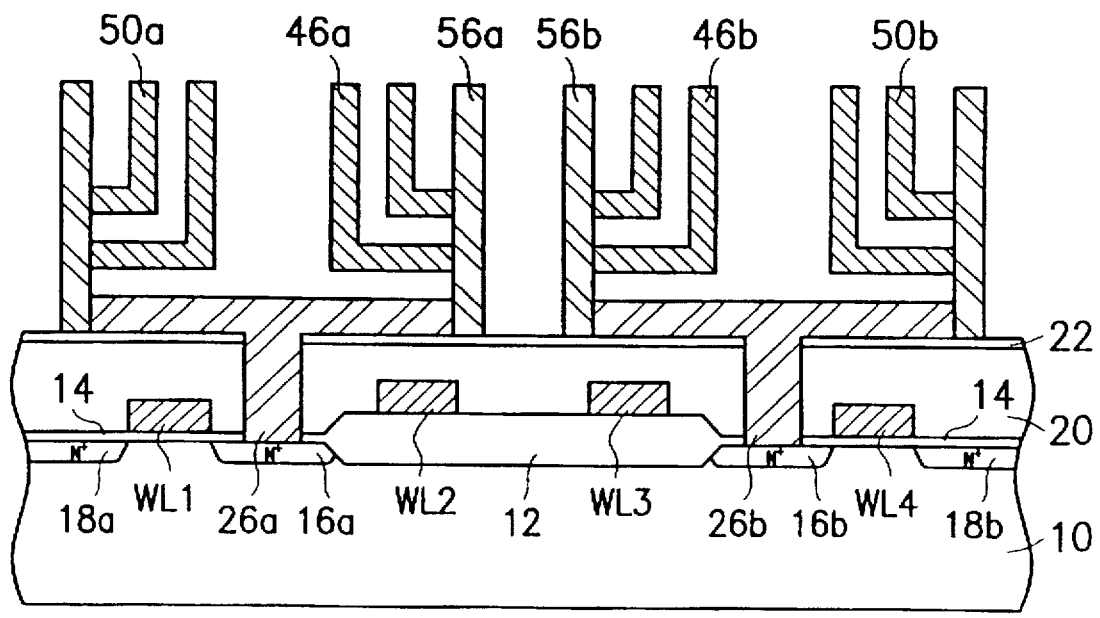

Referring to FIG. 3D, wet etching is performed by using the etching protection layer 22 as an etch end point to remove the exposed silicon dioxide layers, which are the insulating layers 52, 48, and 44, and the insulating pillars 28a, 28b. After the wet etching step, the storage electrode of the DRAM storage capacitor is complete. The storage electrode shown in FIG. 3D includes the lower trunk-like polysilicon layers 26a, 26b, the upper trunk-like polysilicon layers 56a, 56b, and the two layers of branch-like polysilicon 46a, 50a, 46b, 50b, which are substantially L-shaped in cross section. The lower trunk-like polysilicon layers 26a, 26b directly contact the drain regions 16a, 16b of the transfer transistor, respectively. The cross sections of the lower polysilicon layers 26a, 26b are T-shaped. The upper trunk-like polysilicon layers 56a, 56b connect to the edges of the lower trunk-like polysilicon layers 26a, 26b, respectively, and stands substantially vertically. The upper trunk-like polysilicon layers 56a, 56b are formed as hollow cylinders, the cross sections of which can be circular or rectangular. The two layers of the branch-like polysilicon 46a, 50a, 46b, 50b connect to the inner surfaces of the upper polysilicon layers 56a, 56b, respectively, and first extend horizontally inward for a determined distance, and then extend vertically upright.

Figure 3E:
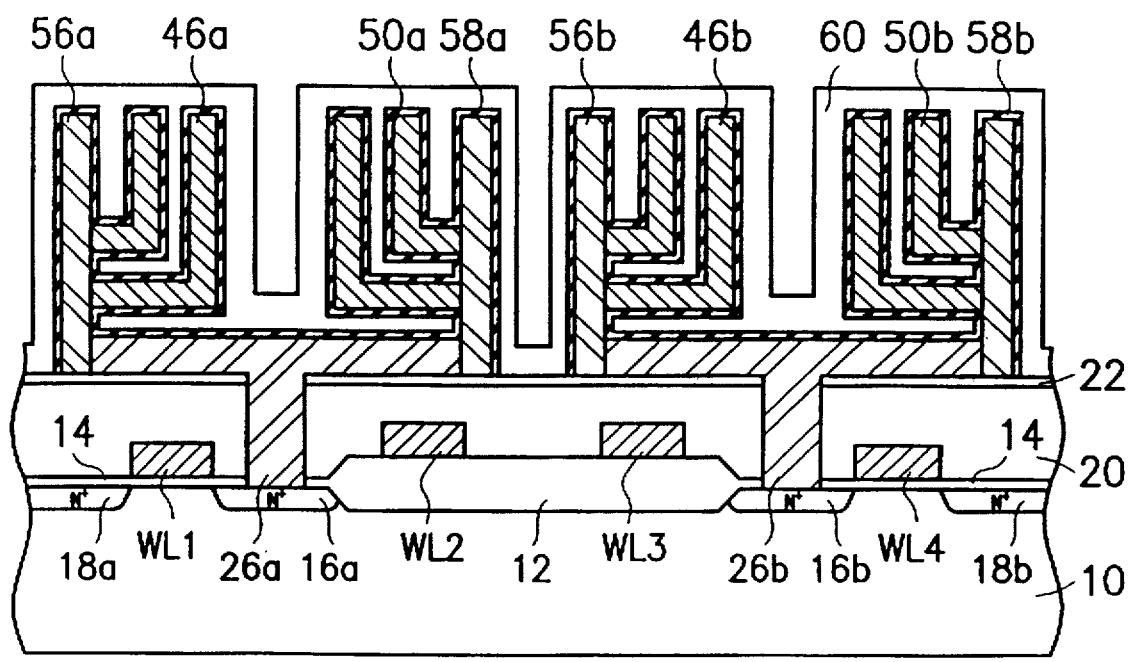

Referring to FIG. 3E, dielectric films 58a, 58b are formed on the surface of the storage electrodes (26a, 46a, 50a, 56a) and (26b, 46b, 50b, 56b), respectively. Then, opposing electrodes 60 made of polysilicon are formed on the surface of the dielectric films 58a, 58b. The opposing electrodes are fabricated by forming a polysilicon layer with a thickness of, for example, 1000 angstroms, by CVD, doping the polysilicon layer with, for example, an N-type dopant to increase the conductivity, and patterning the polysilicon layer using conventional photolithography and etching techniques. The storage capacitor of the DRAM cell is then complete.

Third Preferred Embodiment

In the first and second preferred embodiments, the branch-like electrode layers of the storage electrode have L-shaped cross sections. However, the invention is not limited thereto. A branch-like electrode layer having a pillar-shaped cross section will be described, as the next preferred embodiment.

A process for fabricating the third preferred embodiment of the invention, relating to a semiconductor memory device with a tree-type storage capacitor, is described in detail with reference to FIG. 4A through FIG. 4D.

The tree-type storage capacitor of the third embodiment is based on the wafer structure of FIG. 2C and includes further elements. Elements in FIGS. 4A through 4D that are identical to those in FIG. 2C are labeled with the same reference numerals.

Figure 4A:
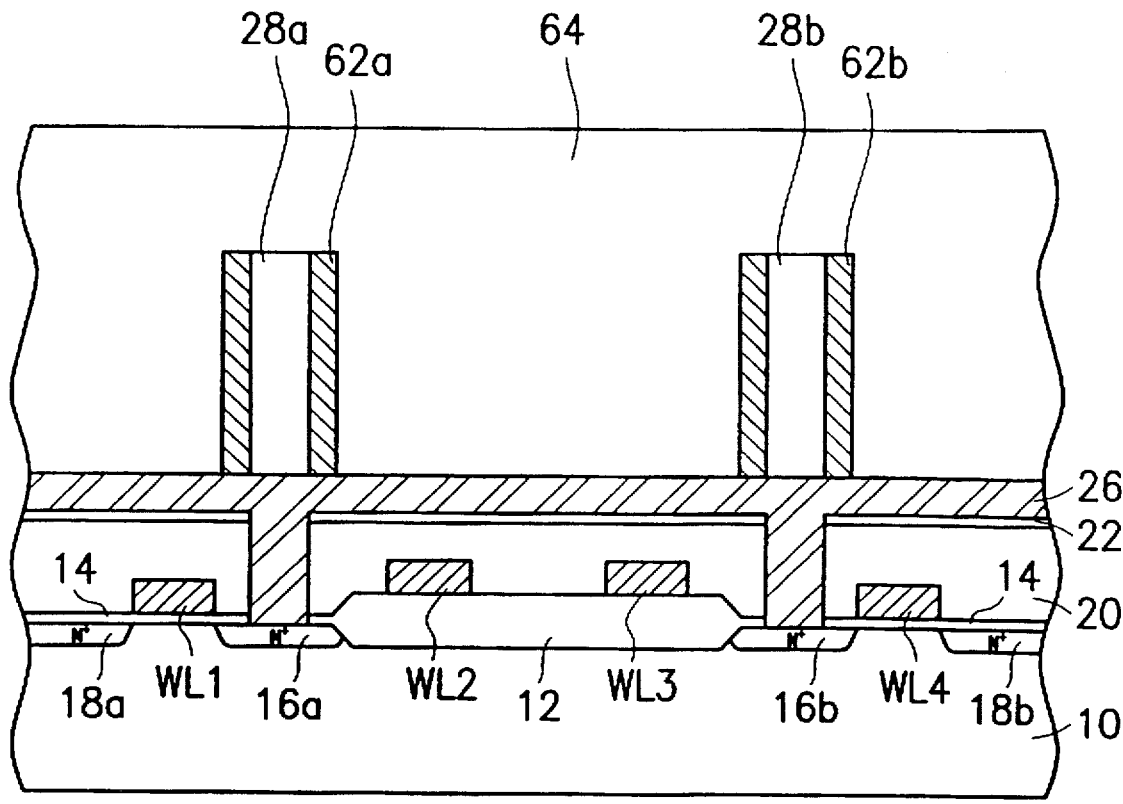
FIGS. 4A through 4D are cross-sectional views depicting process steps for fabricating a third embodiment of a semiconductor memory cell having a tree-type capacitor according to the invention.

Referring to FIGS. 2C and 4A, polysilicon spacers 62a, 62b are formed on the sidewalls of the insulating pillars 28a, 28b. According to the third preferred embodiment, the polysilicon spacers 62a, 62b are fabricated by depositing a polysilicon layer with a thickness of about 1000 angstroms and etching back the polysilicon layer to form the spacers 62a, 62b. To improve the conductivity of the polysilicon layer, ions such as arsenic can be implanted into the polysilicon layer. Then, CVD is performed to deposit a thick insulating layer 64. Preferably, the gap between the insulating pillars 28a, 28b is therefore filled.

Figure 4B:
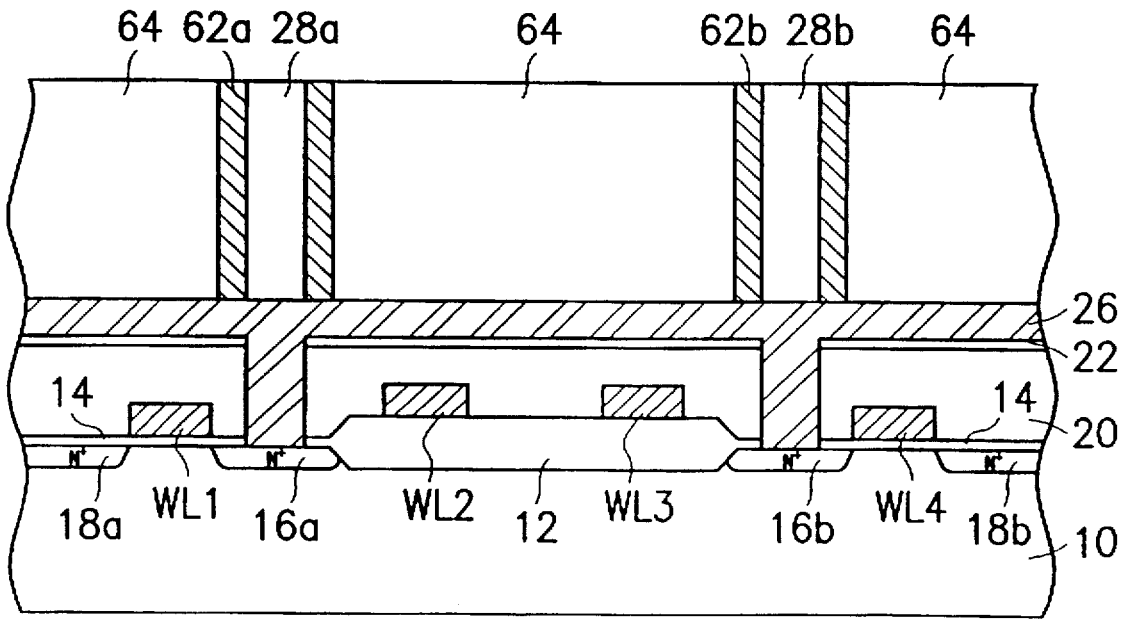

Referring to FIG. 4B, a CMP technique is utilized to polish the surface of the structure shown in FIG. 4A, preferably until the tops of the insulating pillars 28a, 28b and the polysilicon spacers 62a, 62b are exposed.

Figure 4C:
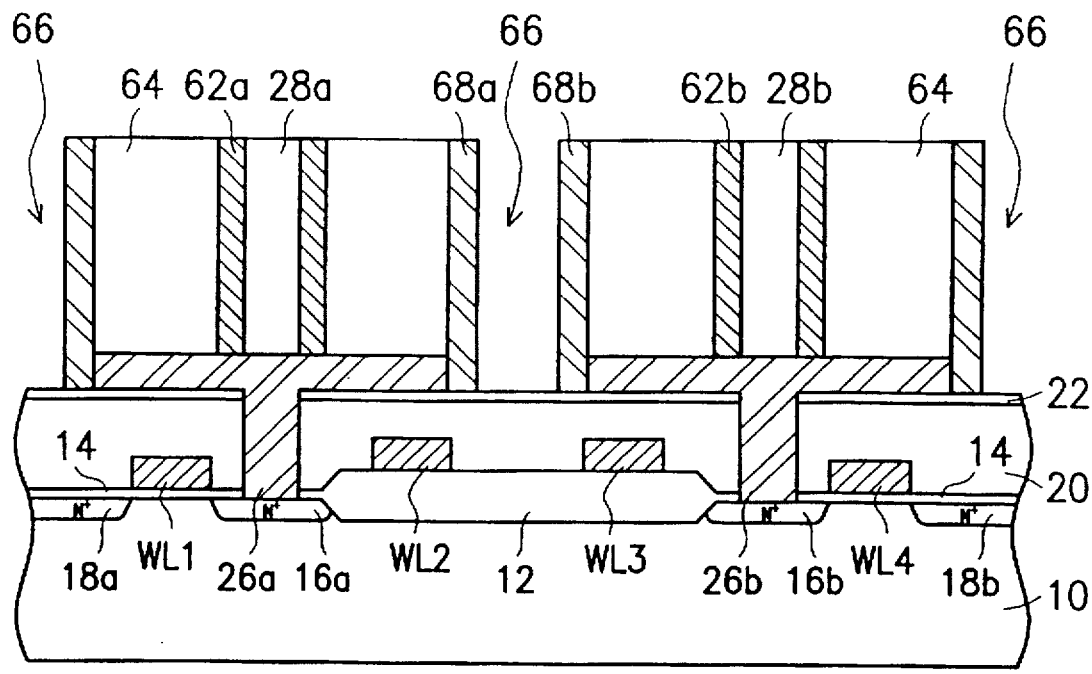

Referring to FIG. 4C, conventional photolithography and etching techniques are utilized to etch the thick insulating layer 64 and the polysilicon layer 26 in succession; thus, an opening 66 is formed and the storage electrode of the storage capacitor for each memory cell is patterned. Also by the above-mentioned etching step, the polysilicon layer 26 is divided into segments 26a, 26b, respectively. Then, polysilicon spacers 68a, 68b are formed on the sidewalls of the opening 66.

Figure 4D:
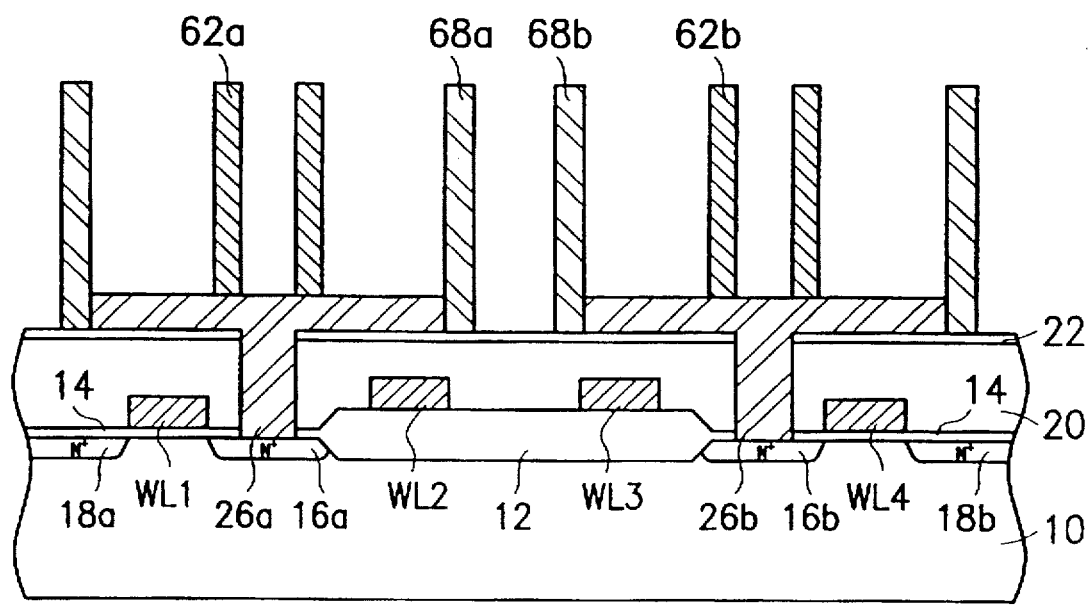

Referring to FIG. 4D, wet etching is performed by using the etching protection layer 22 as an etch end point to remove the exposed silicon dioxide layers, which are the insulating layer 64, and the insulating pillars 28a, 28b. After the wet etching step, the storage electrode of the DRAM storage capacitor is complete. The storage electrode shown in FIG. 4D includes the lower trunk-like polysilicon layers 26a, 26b, the upper trunk-like polysilicon layers 68a, 68b, and the branch-like polysilicon layers 62a, 62b, which are substantially pillar-shaped in cross section. The lower trunk-like polysilicon layers 26a, 26b directly contact the drain regions 16a, 16b of the transfer transistor, respectively. The cross sections of the lower polysilicon layers 26a, 26b are T-shaped. The upper trunk-like polysilicon layers 68a, 68b connect to the edges of the lower trunk-like polysilicon layers 26a, 26b, respectively, and stand substantially vertically. The upper truck-like polysilicon layers 68a, 68b are formed as hollow cylinders, the cross sections of which can be circular or rectangular. The branch-like polysilicon layers 62a, 62b connect to the top surface of the lower trunk-like polysilicon layers 26a, 26b and extend upright. According to the third preferred embodiment, the polysilicon layers 62a, 62b are formed as substantially hollow cylinders, the cross sections of which depend mainly on the cross section of the insulating pillars 28a, 28b, which can be circular or rectangular. The branch-like polysilicon layers 62a, 62b are located between the upper trunk-like polysilicon layers 68a, 68b.

Fourth Preferred Embodiment

The following fourth preferred embodiment of the storage capacitor, which includes branch-like electrode layers that are L-shaped in cross section, and branch-like electrode layers that are pillar-shaped in cross section, is described. The fourth preferred embodiment is accomplished by combining aspects of the first and the third preferred embodiments. Therefore, a structure combining the characteristics of the first and third preferred embodiments is constructed.

A process for fabricating the fourth preferred embodiment of the invention, relating to a semiconductor memory device with a tree-type storage capacitor, is described in detail with reference to FIG. 5A through FIG. 5C.

The storage capacitor of the fourth embodiment is based on the wafer structure of FIG. 2C. Elements in FIGS. 5A through 5E that are identical to those in FIG. 2C are labeled with the same reference numerals.

Figure 5A:
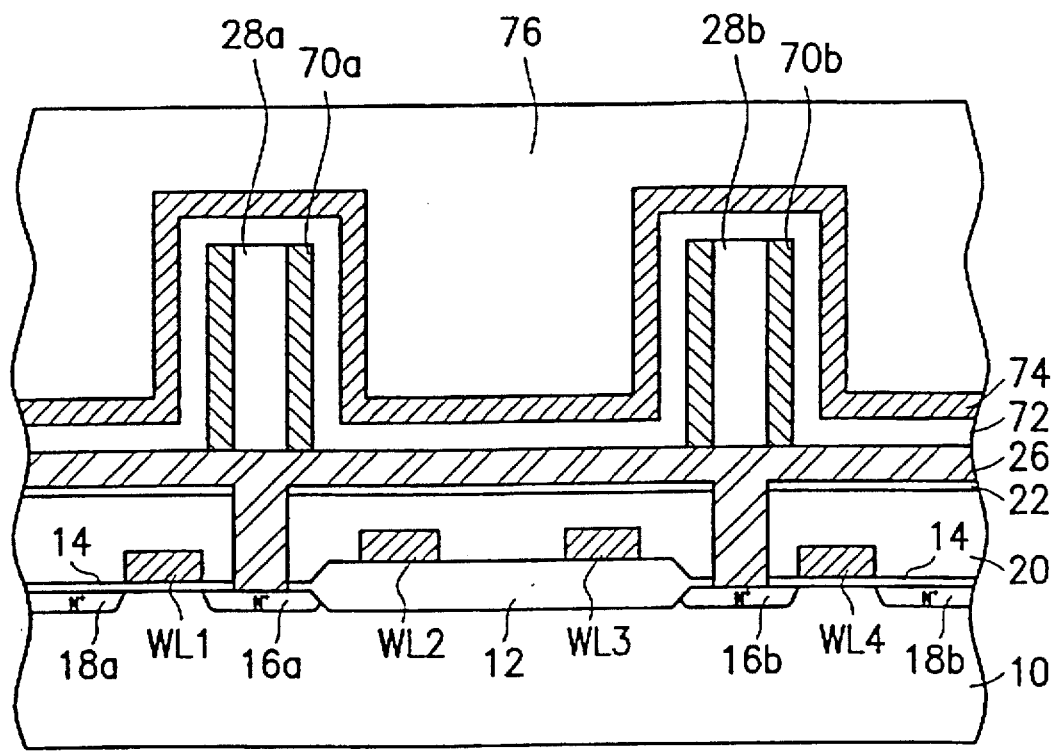
FIGS. 5A through 5C are cross-sectional views depicting process steps for fabricating a fourth embodiment of a semiconductor memory cell having a tree-type capacitor according to the invention.

Referring to FIGS. 2C and 5A, polysilicon spacers 70a, 70b are formed on the sidewalls of the insulating pillars 28a, 28b, respectively. The polysilicon spacers are fabricated by depositing a polysilicon layer with a thickness of about 1000 angstroms, and etching back the polysilicon layer to form spacers. Then, an insulating layer 72 and a polysilicon layer 74 are deposited in succession by CVD. After that, a thick insulating layer is deposited.

Figure 5B:
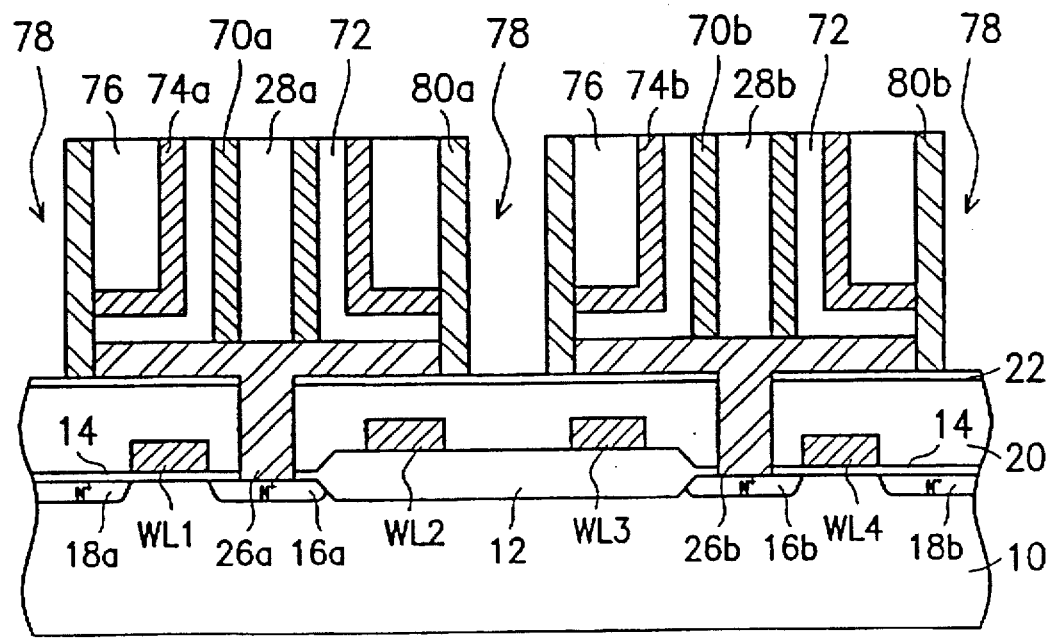

Referring to FIG. 5B, the structure shown is constructed by the processes previously described with reference to FIGS. 2E and 2F. In other words, a CMP technique is utilized to polish the surface of the structure shown in FIG. 5A until the tops of the insulating pillars 28a, 28b, the tops of the polysilicon spacers 70a, 70b, and the tops of the polysilicon layer 74 are exposed.

Conventional photolithography and etching techniques are utilized to etch the insulating layer 76, the polysilicon layer 74, the insulating layer 72, and the polysilicon layer 26, in succession; thus, an opening 78 is formed and the storage electrode of the storage capacitor for each memory cell is patterned. Also by the above-mentioned etching step, the polysilicon layers 74 and 26 are divided into segments 74a, 74b, and 26a, 26b, respectively. Then, polysilicon spacers 80a, 80b are formed on the sidewalls of the opening 78.

Figure 5C:
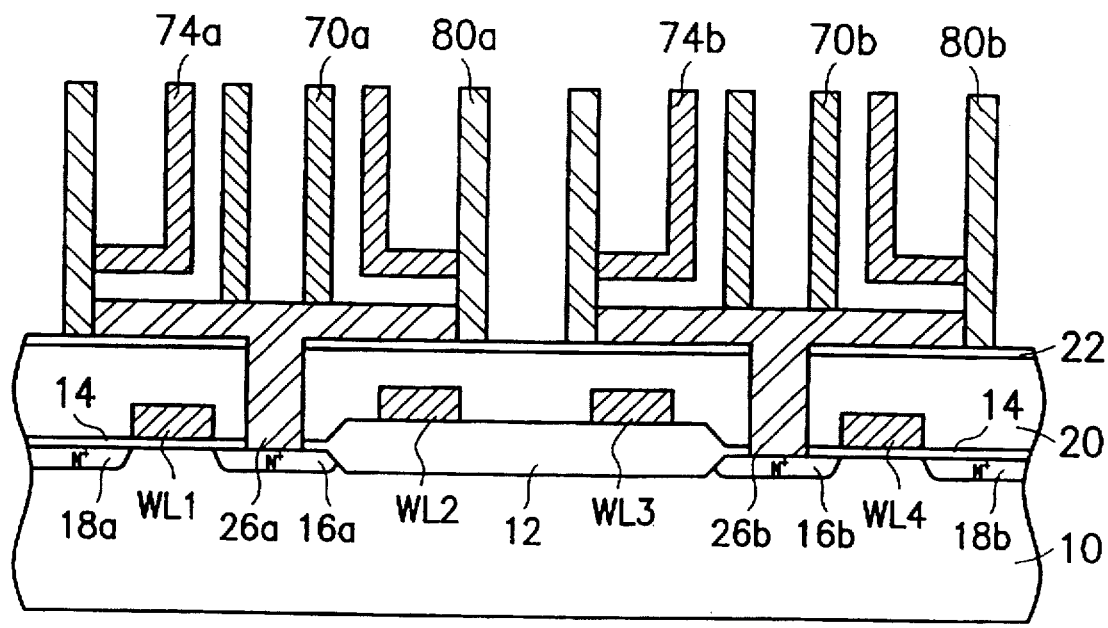

Referring to FIG. 5C, wet etching is performed by using the etching protection layer 22 as an etch end point to remove the exposed silicon dioxide layers, which are the insulating layers 76 and 72, and the insulating pillars 28a, 28b. After the wet etching step, the storage electrode of the DRAM storage capacitor is complete. The storage electrode shown in FIG. 5C includes the lower trunk-like polysilicon layers 26a, 26b, the upper trunk-like polysilicon layers 80a, 80b, the branch-like polysilicon layers 70a, 70b which are substantially pillar-shaped in cross section, and the branch-like polysilicon layers 74a, 74b which are substantially L-shaped in cross section.

The lower trunk-like polysilicon layers 26a, 26b directly contact the drain regions 16a, 16b of the transfer transistor, respectively. The cross sections of the lower polysilicon layers 26a, 26b are T-shaped. The upper trunk-like polysilicon layers 80a, 80b connect to the edges of the lower trunk-like polysilicon layers 26a, 26b, respectively, and stand substantially vertically. The upper truck-like polysilicon layers 80a, 80b are formed as hollow cylinders; the cross sections of which can be circular or rectangular. The branch-like polysilicon layers 74a, 74b, which are substantially L-shaped in cross section, connect to the inner surface of the upper polysilicon layer 80a, 80b, extend inwards horizontally for a determined distance, and then extend substantially upright. The branch-like polysilicon layers 70a, 70b, which are substantially pillar-shaped in cross section, connect to the top surfaces of the lower trunk-like polysilicon layers 26a, 26b and extend substantially upright. The branch-like polysilicon layers 70a, 70b are formed as substantially hollow cylinders.

Fifth Preferred Embodiment

Another storage electrode with a structure similar to the one disclosed as the fourth embodiment, but fabricated in a different manner, is disclosed as the fifth preferred embodiment.

A process for fabricating the fifth preferred embodiment of the invention, relating to a semiconductor memory device with a tree-type storage capacitor, is described in detail with reference to FIG. 6A through FIG. 6D.

The storage capacitor of the fifth embodiment is based on the wafer structure of FIG. 2C. Elements in FIGS. 6A through 6D that are identical to those in FIG. 2C are labeled with the same reference numerals.

Figure 6A:
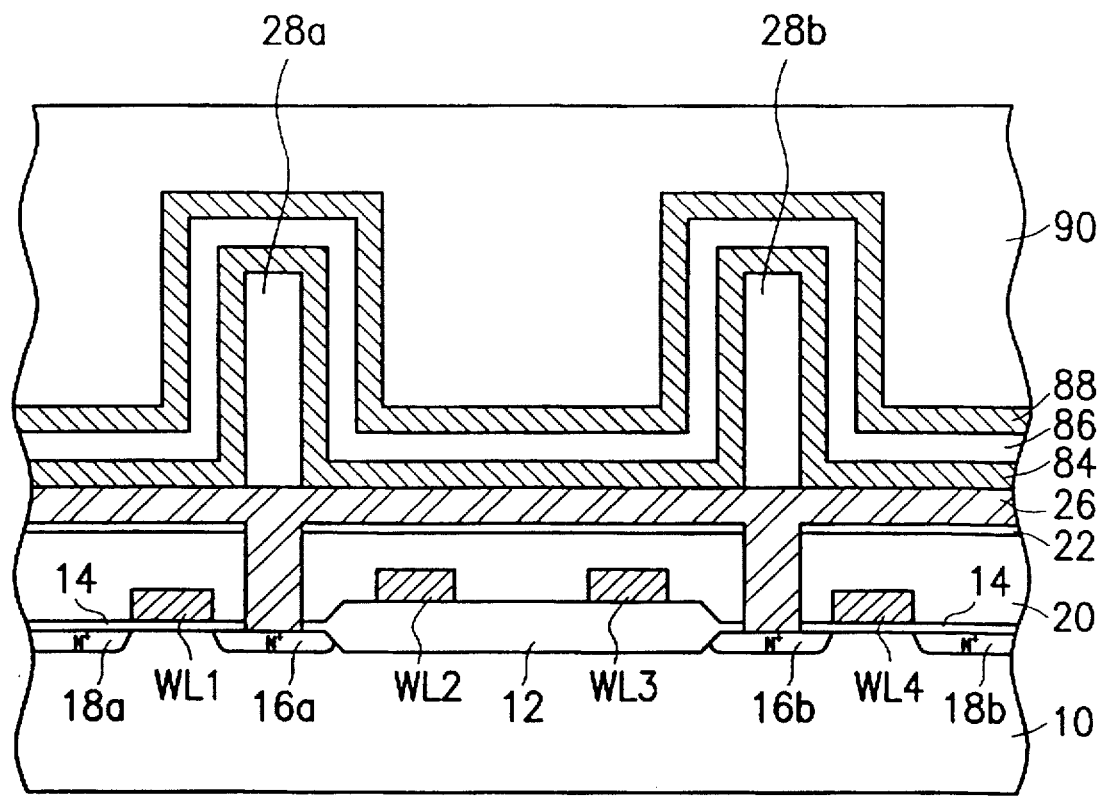
FIGS. 6A through 6D are cross-sectional views depicting process steps for fabricating a fifth embodiment of a semiconductor memory cell having a tree-type capacitor according to the invention.

Referring to FIGS. 2C and 6A, polysilicon layers and insulating layers are deposited alternately by CVD. As shown in FIG. 6A, a polysilicon layer 84, an insulating layer 86, a polysilicon layer 88, and a thick insulating layer 90 are deposited in succession.

Figure 6B:
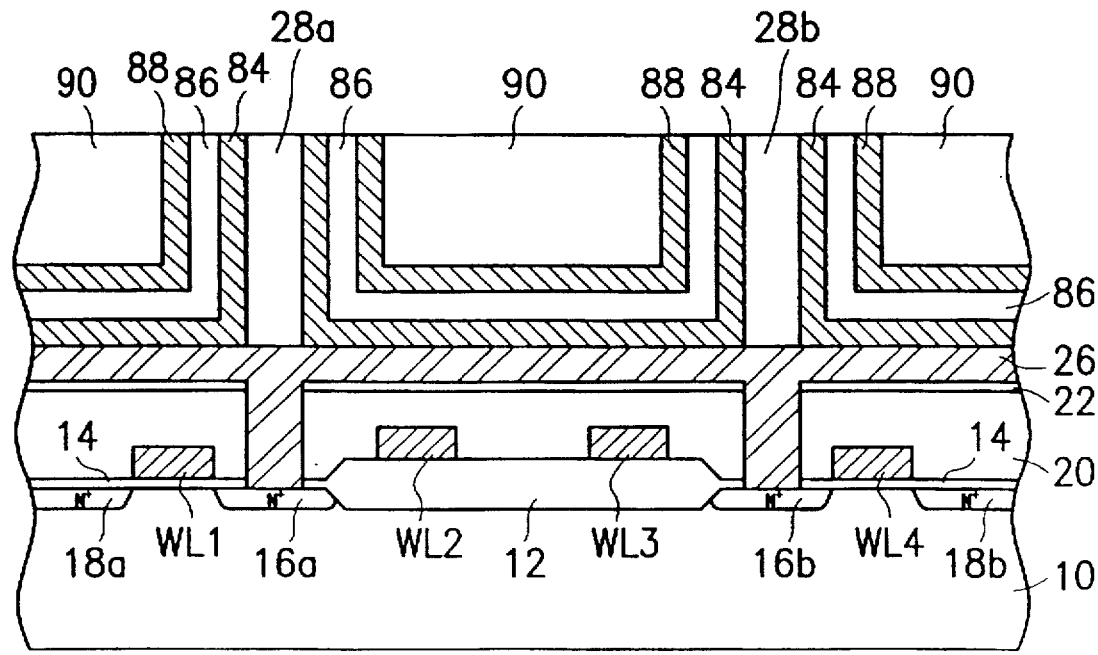

Referring to FIG. 6B, a CMP technique is utilized to polish the surface of the structure shown in FIG. 6A until the tops of the insulating pillars 28a, 28b are exposed.

Figure 6C:
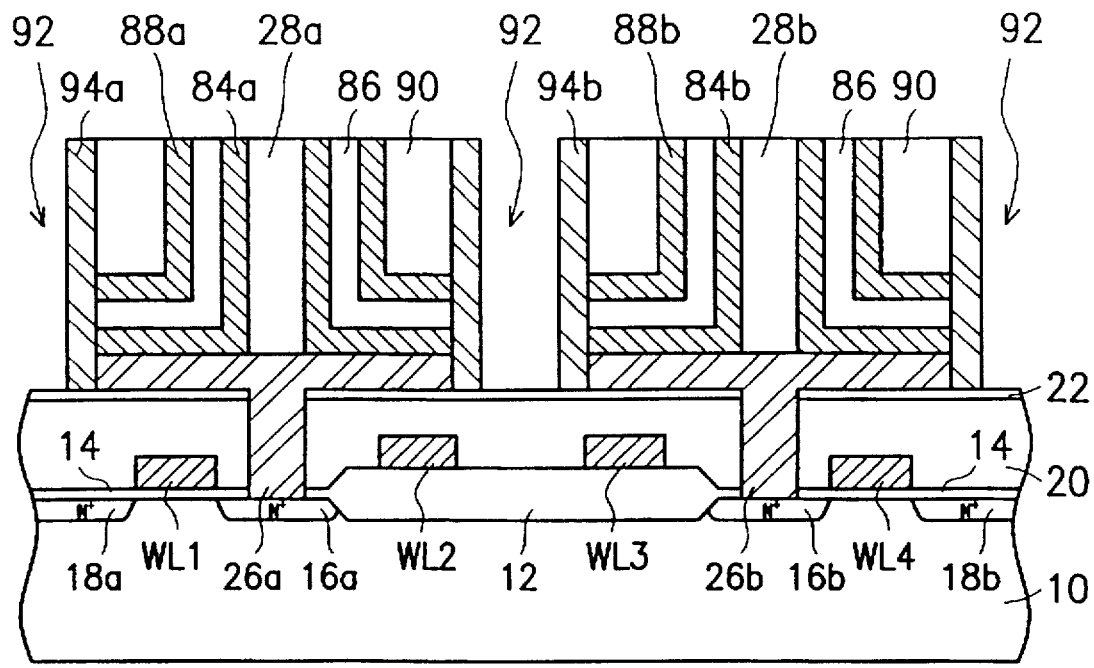

Referring to FIG. 6C, conventional photolithography and etching techniques are employed to etch the insulating layer 90, the polysilicon layer 88, the insulating layer 86, the polysilicon layer 84, and the polysilicon layer 26 in succession; thus, an opening 92 is formed and the storage electrode of the storage capacitor for each memory cell is patterned. Also by the above-mentioned etching step, the polysilicon layers 88, 84, and 26 are divided into segments 88a, 88b, 84a, 84b, and 26a, 26b, respectively. Then, polysilicon spacers 94a, 94b are formed on the sidewalls of the opening 92.

Figure 6D:
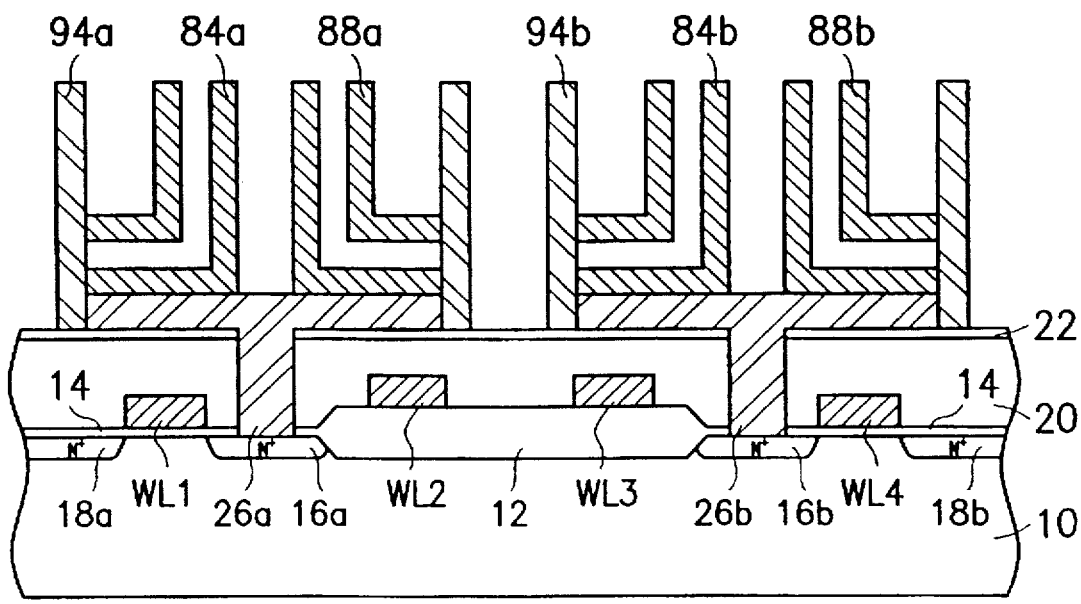

Referring to FIG. 6D, wet etching is performed by using the etching protection layer 22 as an etch end point to remove the exposed silicon dioxide layers, which are the insulating layers 90 and 86, and the insulating pillars 28a, 28b. After the wet etching step, the storage electrode of the DRAM storage capacitor is complete. The storage electrode shown in FIG. 6D includes the lower polysilicon layers 26a, 26b, the upper trunk-like polysilicon layers 94a, 94b, and the two layers of branch-like polysilicon 84a, 88a, 84b, 88b, which are substantially L-shaped in cross section. The lower trunk-like polysilicon layers 26a, 26b directly contact the drain regions 16a, 16b of the transfer transistor, respectively. The cross sections of the lower polysilicon layers 26a, 26b are T-shaped. The upper trunk-like polysilicon layers 94a, 94b connect to the edges of the lower trunk-like polysilicon layers 26a, 26b, respectively, and stand substantially vertically. The upper trunck-like polysilicon layers 94a, 94b are formed as hollow cylinders, the cross sections of which can be circular or rectangular. The two layers of branch-like polysilicon layers 84a, 88a, 84b, 88b connect to the inner surfaces of the upper trunk-like polysilicon layers 94a, 94b, respectively, and first extend horizontally inward for a determined distance, and then extend substantially upright. The structure according to this preferred embodiment differs from the second preferred embodiment (FIG. 3A through 3E) in that the bottoms of the branch-like polysilicon layers 84a, 84b contact directly with the upper surfaces of the lower trunk-like polysilicon layers 26a, 26b. Therefore, the structure of the storage electrode according to the fifth preferred embodiment is similar to the structure of the second preferred embodiment.

Sixth Preferred Embodiment

A storage electrode with a different structure fabricated by a different process is described as the sixth preferred embodiment. The structure of the storage electrode according to the sixth preferred embodiment is very much like the structure according to the second preferred embodiment. A difference between the two embodiments is that the lower trunk-like polysilicon layer of the storage electrode according to the sixth preferred embodiment includes a hollow portion. Therefore, the surface area of the storage electrode is increased.

A process for fabricating the sixth preferred embodiment of the invention, relating to a semiconductor memory device with a tree-type storage capacitor, is described in detail with reference to FIG. 7A through FIG. 7D.

The storage capacitor of the sixth preferred embodiment is based on the wafer structure of FIG. 2A. Elements in FIGS. 7A through 7D that are identical to those in FIG. 2A are labeled with the same reference numerals.

Figure 7A:
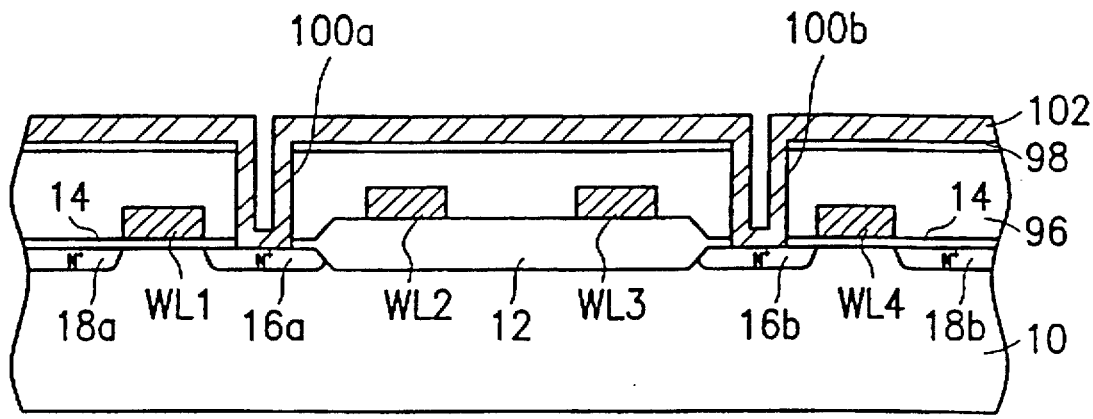
FIGS. 7A through 7D are cross-sectional views depicting process steps for fabricating a sixth embodiment of a semiconductor memory cell having a tree-type capacitor according to the invention.

Referring to FIGS. 2A and 7A, an insulating layer 96, such as BPSG, is deposited by CVD for planarization. Then, an etching protection layer 98, such as silicon nitride, is formed by CVD. Thereafter using conventional photolithography and etching techniques, the etching protection layer 98, the insulating layer 96, and the gate oxide layer 14 are etched in succession; thus, contact holes 100a, 100b for storage electrodes are formed which extend from the upper surface of the etching protection layer 98 to the surface of the drain regions 16a, 16b. Next, a polysilicon layer 102 is deposited. To increase the conductivity of the polysilicon layer, ions such as arsenic are implanted into the polysilicon layer. As shown in FIG. 7A, the polysilicon layer 102 covers the surface of the etching protection layer 98 and the inner sidewalls of the contact holes 100a, 100b but does not completely fill the contact holes 100a, 100b. Subsequently, the polysilicon layer 102 is hollow and U-shaped in cross section.

Figure 7B:
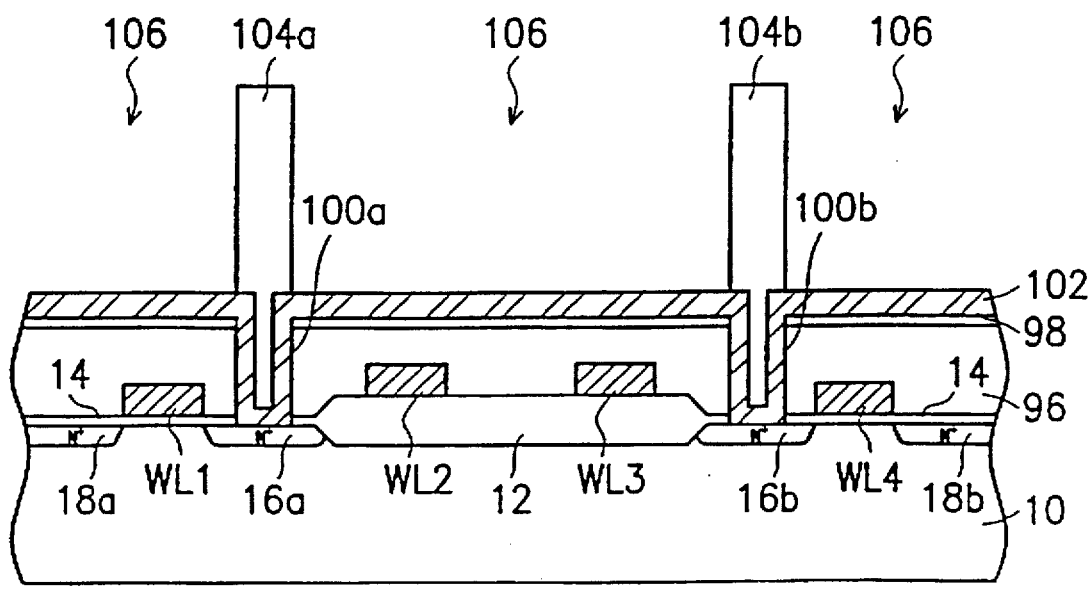

Referring to FIG. 7B, a thick insulating layer, such as a silicon dioxide layer with a thickness of about 7000 angstroms, is deposited. Then, the thick insulating layer is defined using conventional photolithography and etching techniques, such that insulating pillars 104a, 104b are formed as shown in FIG. 7B. The insulating pillars 104a, 104b are preferably located above the drain regions 16a and 16b, respectively, on the polysilicon layer 26 and completely fill the hollow structure of the polysilicon layer 102. Gaps 106 are thus formed between the insulating pillars 104a, 104b.

Next, a method similar to that disclosed in accordance with the second preferred embodiment with reference to FIG. 3A through FIG. 3D, is performed to construct the storage electrode according to the sixth preferred embodiment.

Figure 7C:
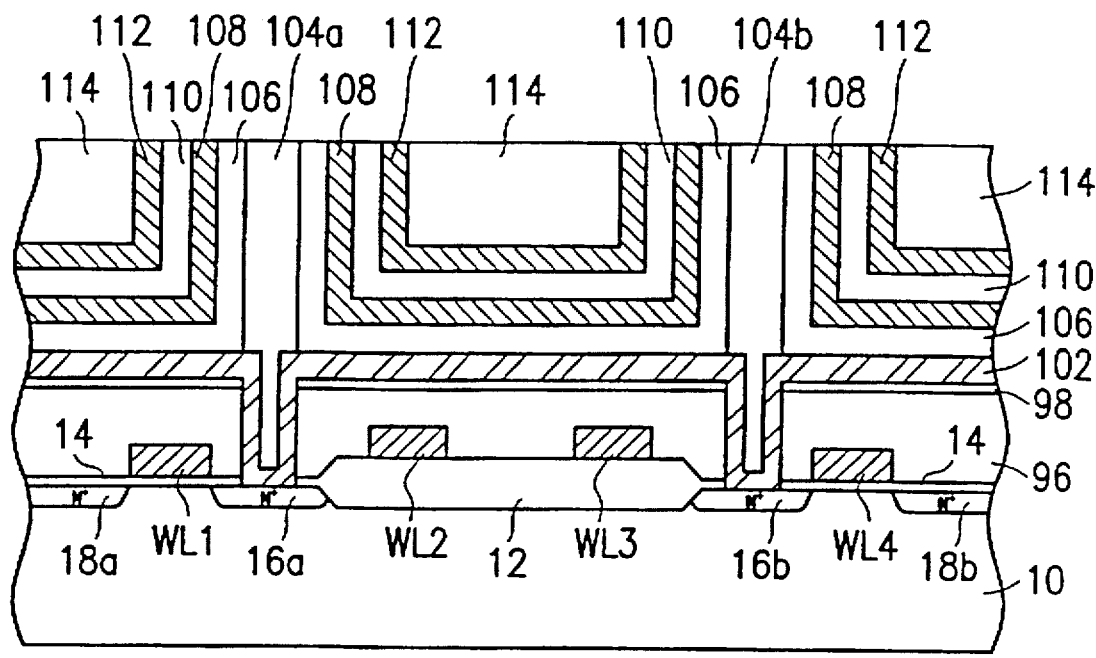

Referring to FIG. 7C, CVD is performed to alternately form insulating layers and polysilicon layers, in particular an insulating layer 106, a polysilicon layer 108, an insulating layer 110, a polysilicon layer 112, and a thick insulating layer 114, in succession. A CMP technique can be utilized to polish the surface of the structure until at least the tops of the insulating pillars 104a, 104b are exposed.

Figure 7D:
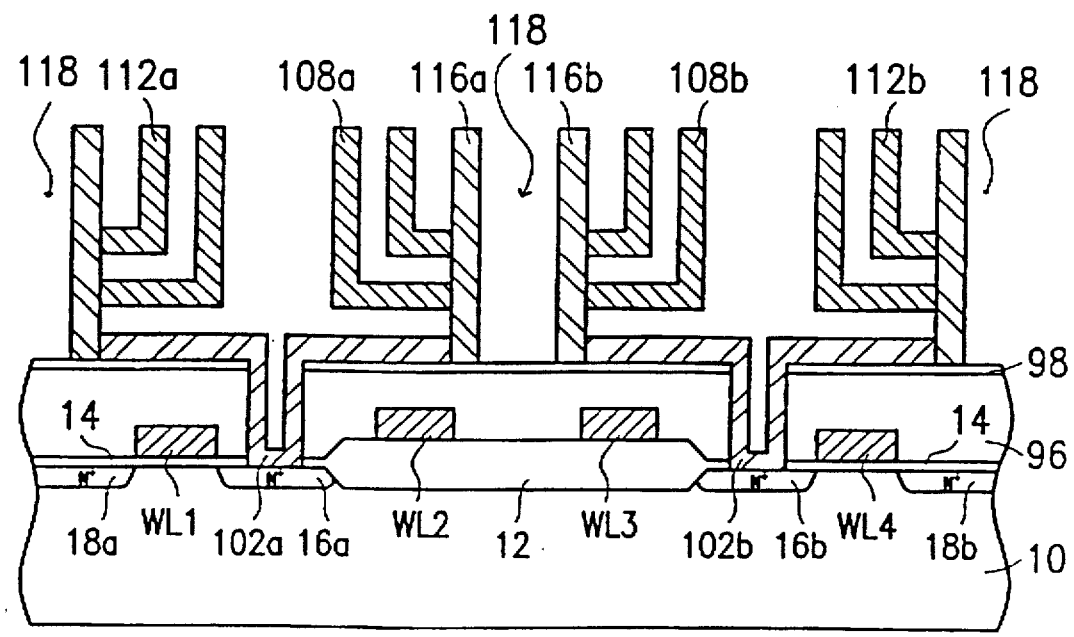

Referring to FIG. 7D, conventional photolithography and etching techniques are utilized to etch the insulating layer 114, the polysilicon layer 112, the insulating layer 110, the polysilicon layer 108, the insulating layer 106, and the polysilicon layer 102 in succession; thus, an opening 118 is formed and the storage electrode of the storage capacitor for each memory cell is patterned. Also by the above-mentioned etching step, the polysilicon layers 112, 108, and 102 are divided into segments 112a, 112b, 108a, 108b, and 102a, 102b, respectively. Then, polysilicon spacers 116a, 116b are formed on the sidewalls of the opening 118. Wet etching is then performed by using the etching protection layer 98 as an etch end point to remove the exposed silicon dioxide layers, which are the insulating layers 114, 110, and 106, and the insulating pillars 104a, 104b. After the wet etching step, the storage electrode of the DRAM storage capacitor is complete. The storage electrode shown in FIG. 7D is very much like the structure shown in FIG. 3D. The difference between the two structures is that the lower trunk-like polysilicon layers 102a, 102b of the sixth preferred embodiment are hollow. Therefore, the surface of the storage electrode is increased.

Seventh Preferred Embodiment

A storage electrode with a different structure fabricated by a different process is described as the seventh preferred embodiment. The structure of the storage electrode according to the seventh preferred embodiment is very much like the structure according to the second preferred embodiment. The difference between the two embodiments is that the lower trunk-like polysilicon layer of the storage electrode according to the seventh preferred embodiment does not contact the upper surface of the lower etching protection layer, but rather is separated by a determined distance. Therefore, the surface of the storage electrode is increased.

A process for fabricating the seventh preferred embodiment of the invention, relating to a semiconductor memory device with a tree-type storage capacitor, is described in detail with reference to FIG. 8A through FIG. 8E.

The storage capacitor of the seventh preferred embodiment is based on the wafer structure of FIG. 2A. Then, different processing steps are performed to fabricate a different structure. Elements in FIGS. 8A through 8E that are identical to those in FIG. 2A are labeled with the same reference numerals.

Figure 8A:
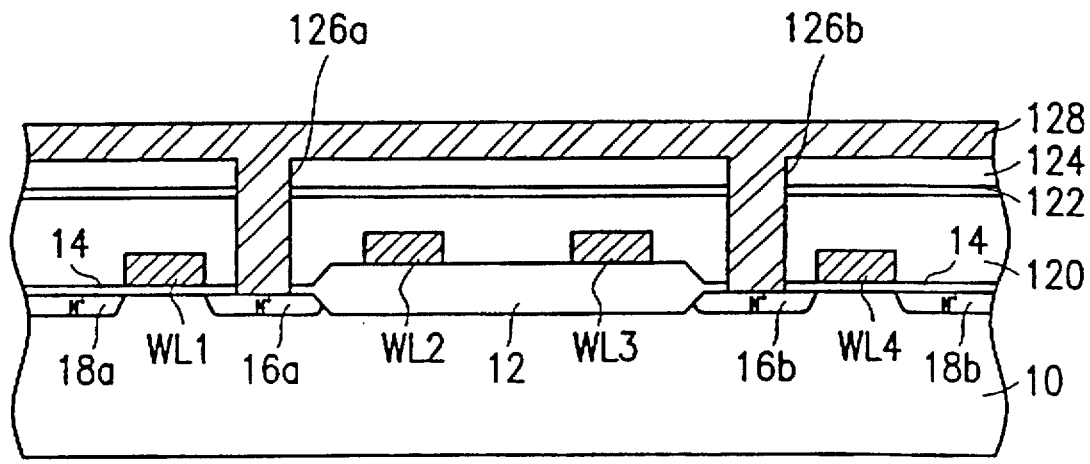
FIGS. 8A through 8E are cross-sectional views depicting process steps for fabricating a seventh embodiment of a semiconductor memory cell having a tree-type capacitor according to the invention.

Referring to FIG. 8A and 2A, an insulating layer 120, such as BPSG for planarization, is deposited by CVD. Then, an etching protection layer 122, such as silicon nitride, is formed by CVD. Next, an insulating layer 124 such as silicon dioxide is deposited by CVD. Next, using conventional photolithography and etching techniques, the insulating layer 124, the etching protection layer 122, the insulating layer 120, and the gate oxide layer 14 are etched in succession; thus, contact holes 126a, 126b for the storage electrode are formed which extend from the upper surface of the insulating layer 124 to the surface of the drain regions 16a, 16b. Next, a polysilicon layer 128 is deposited. As shown in FIG. 8A, the polysilicon layer 128 completely fills the contact holes 126a, 126b and covers the surface of the insulating layer 124.

Figure 8B:
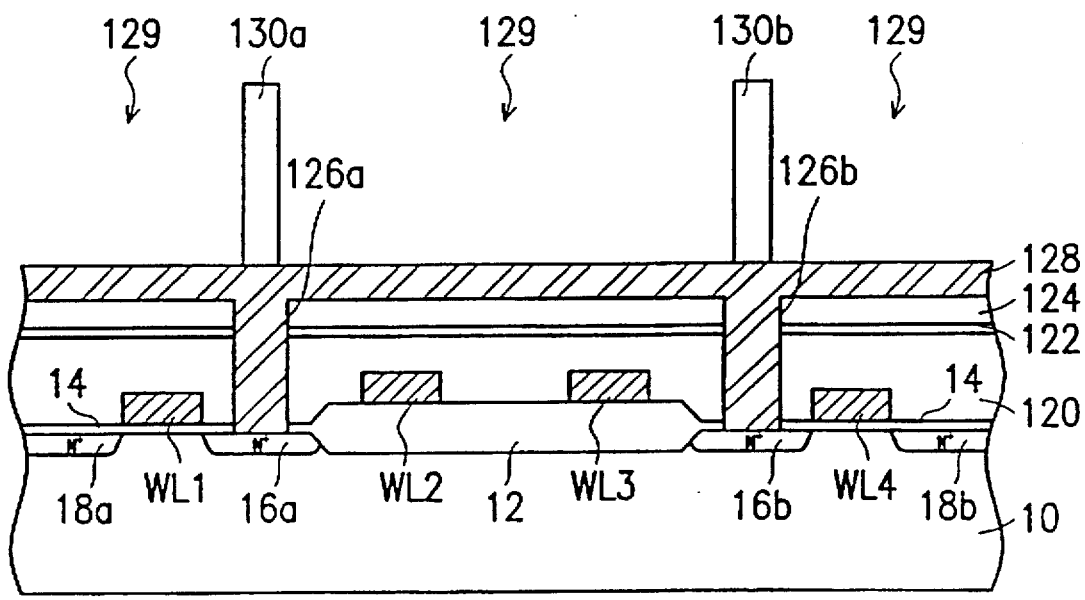

Referring to FIG. 8B, a thick insulating layer, such as a silicon dioxide layer with a thickness of about 7000 angstroms, is deposited. Then, the thick insulating layer is defined by conventional photolithography and etching technique, such that insulating pillars 130a, 130b are formed, as shown in FIG. 8B. The insulating pillars 130a, 130b are preferably located above the drain regions 16a and 16b, respectively, on the polysilicon layer 128. Gaps 129 are thus formed between the insulating pillars.

Next, a method similar to that disclosed in accordance with the second preferred embodiment with reference to FIG. 3A through FIG. 3D, is performed to construct the storage electrode according to the seventh preferred embodiment.

Figure 8C:
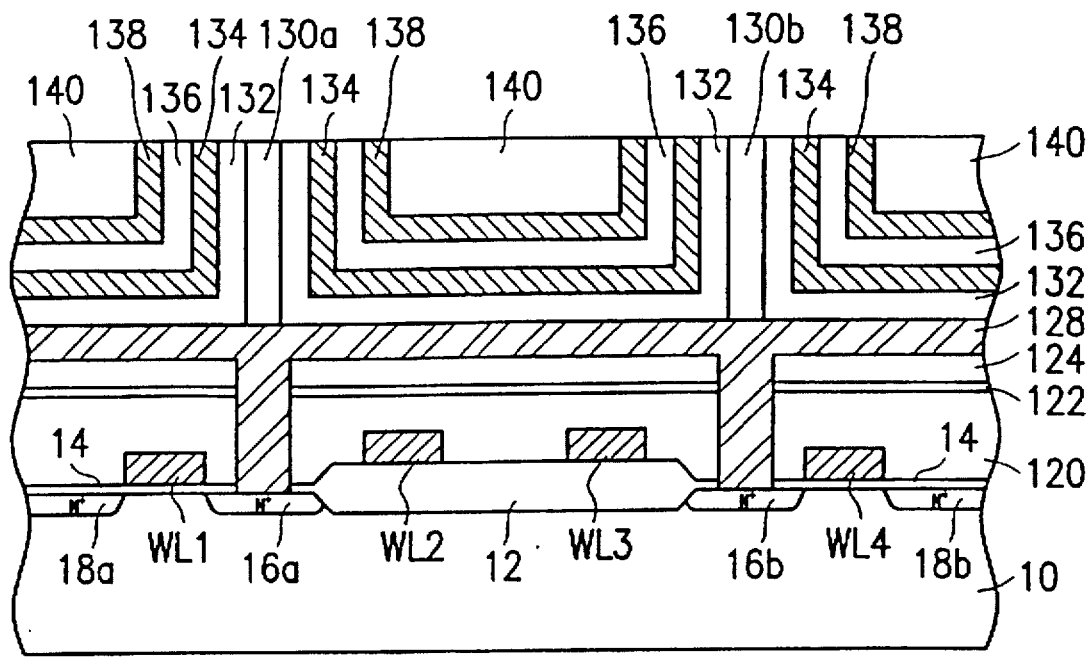

Referring to FIG. 8C, CVD is performed to alternately form insulating layers and polysilicon layers, in particular an insulating layer 132, a polysilicon layer 134, an insulating layer 136, a polysilicon layer 138, and a thick insulating layer 140, in succession. A CMP technique can be utilized, to polish the surface of the structure until at least the tops of the insulating pillars 130a, 130b are exposed.

Figure 8D:
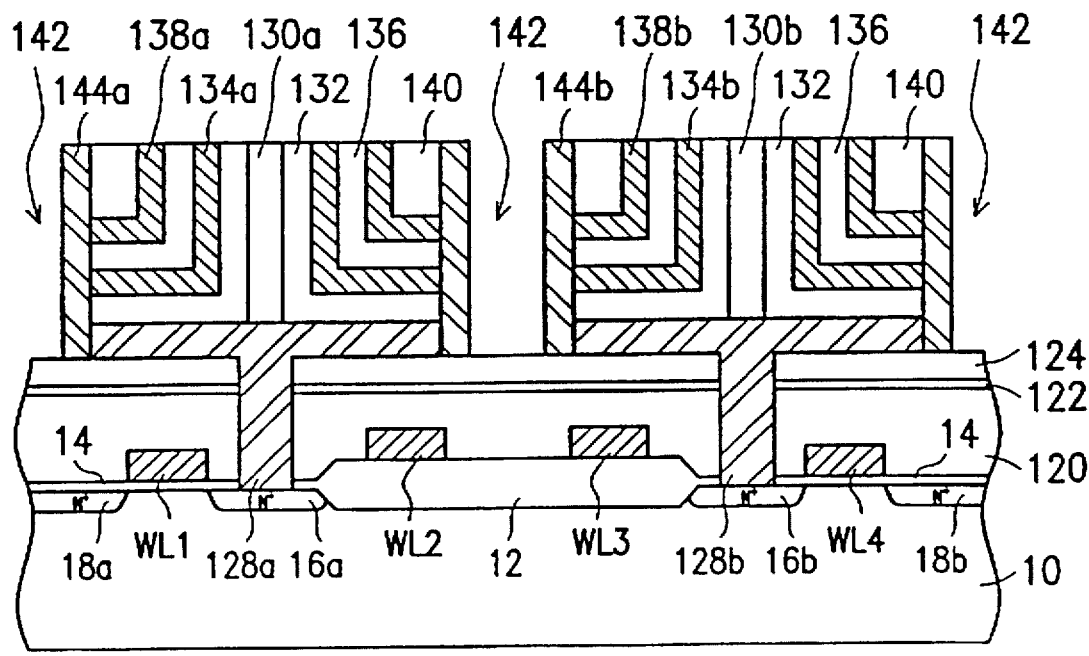

Referring to FIG. 8D, conventional photolithography and etching techniques are utilized to etch the insulating layer 140, the polysilicon layer 138, the insulating layer 136, the polysilicon layer 134, the insulating layer 132, and the polysilicon layer 128 in succession; thus, an opening 142 is formed and the storage electrode of the storage capacitor for each memory cell is patterned. Also by the above-mentioned etching step, the polysilicon layers 138, 134, and 128 are divided into segments 138a, 138b, 134a, 134b, and 128a, 128b, respectively. Then, polysilicon spacers 144a, 144b are formed on the sidewalls of the opening 142.

Figure 8E:
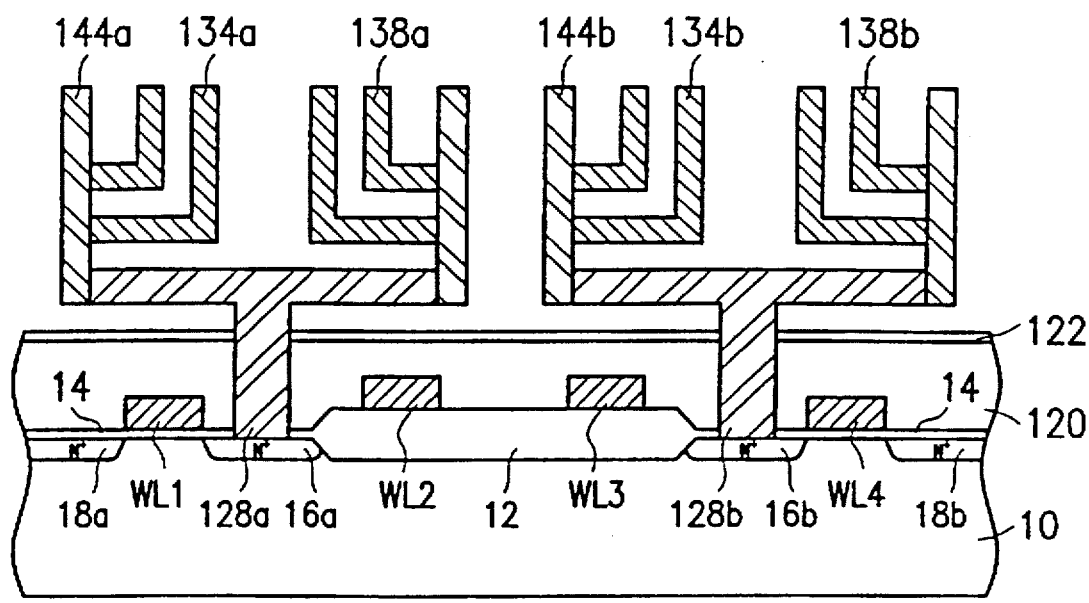

Referring to FIG. 8E, wet etching is performed by using the etching protection layer 122 as an etch end point to remove the exposed silicon dioxide layers, which are the insulating layers 140, 136, 132, and 124, and the insulating pillars 130a, 130b. After the wet etching step, the storage electrode of the DRAM storage capacitor is complete. The storage electrode shown in FIG. 8E is very much like the structure shown in FIG. 3D. The difference between the two structures is that the lower horizontal surface of the lower trunk-like polysilicon layers 128a, 128b do not contact the top surface of the etching protection layer 122 underneath. Therefore, the surface of the storage electrode is increased.

Eighth Preferred Embodiment

In the first through seventh preferred embodiments, the branch-like electrode layers of the storage electrodes are either vertical structures with single segments or folded structures with two segments that are substantially L-shaped in cross section. However, the invention is not limited in scope to these structures. The number of segments attributed to the folds of the branch-like electrode layer can be three, four, or more. A branch-like electrode layer with four segments is described in detail as the eighth preferred embodiment.

A process for fabricating the eighth preferred embodiment of the invention, relating to a semiconductor memory device with a tree-type storage capacitor, is described in detail with reference to FIG. 9A through FIG. 9E.

The storage capacitor of the eighth preferred embodiment is based on the wafer structure of FIG. 2B. Then, different processing steps are performed to fabricate a different structure. Elements in FIGS. 9A through 9E that are identical to those in FIG. 2A are labeled with the same reference numerals.

Figure 9A:
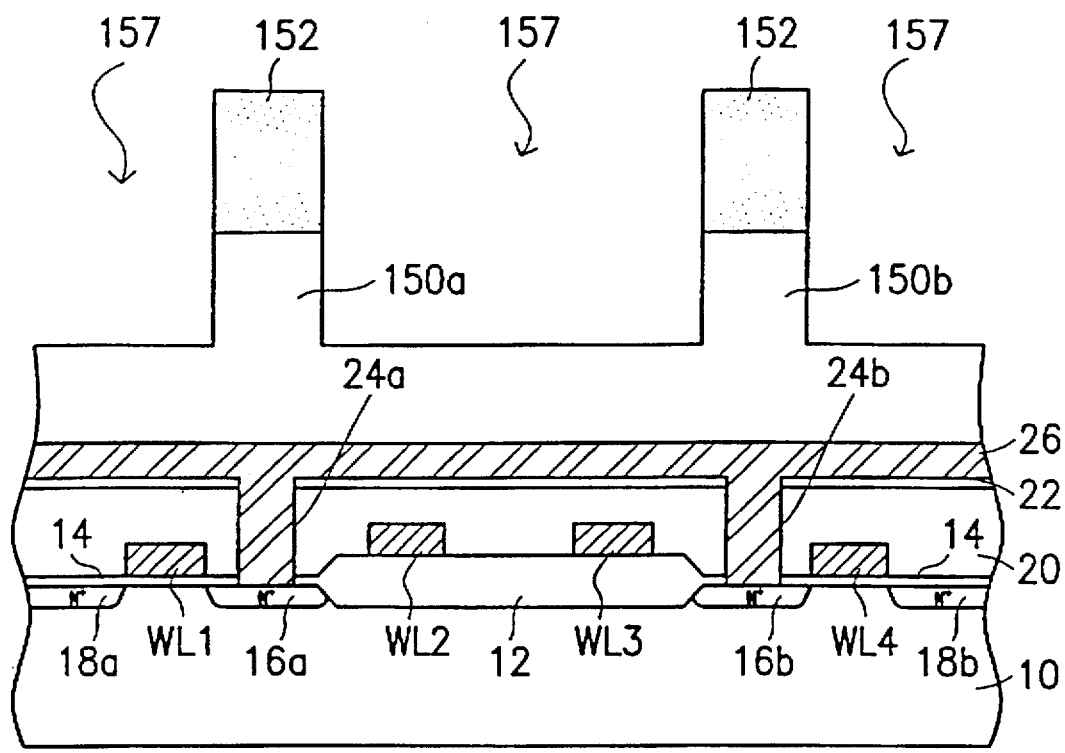
FIGS. 9A through 9E are cross-sectional views depicting process steps for fabricating an eighth embodiment of a semiconductor memory cell having a tree-type capacitor according to the invention.

Referring to FIGS. 9A and 2B, a thick insulating layer, such as a silicon dioxide layer with a thickness of about 7000 angstroms, is deposited over the polysilicon layer 26. A photoresist layer 152 is then formed by a conventional photolithography technique and further is anisotropically etched to form parts of the insulating layer. Therefore, the insulating layers 150a, 150b are formed with gaps 157 there between, as shown in FIG. 9A.

Figure 9B:
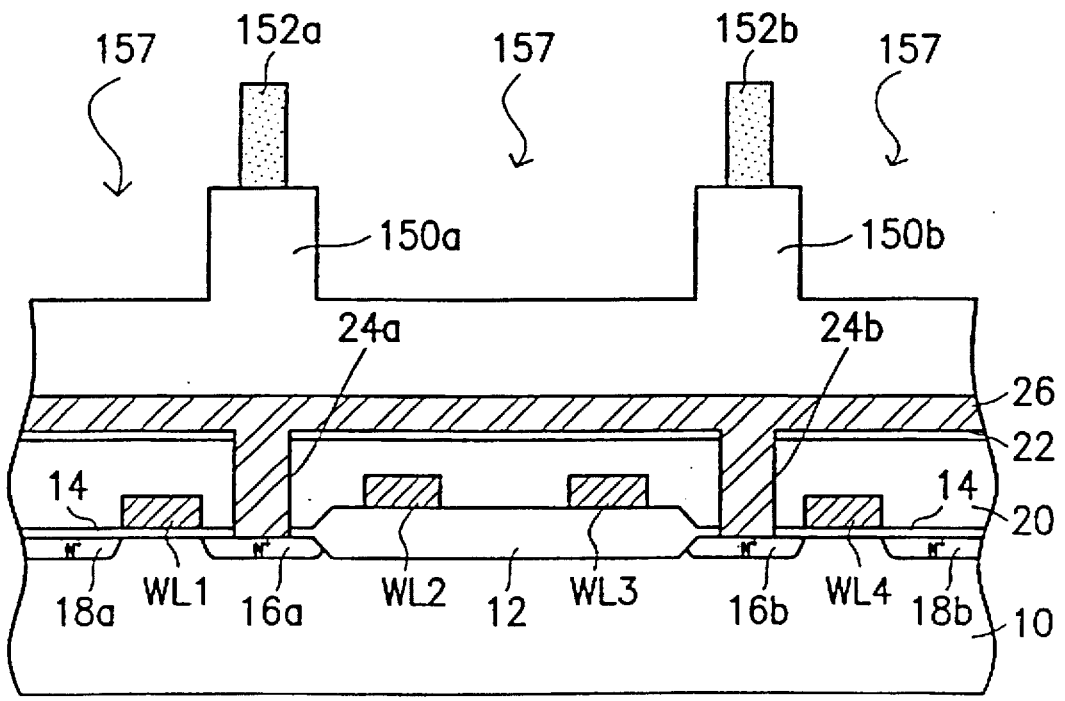

Referring to FIG. 9B, a photoresist erosion technique is utilized to remove portions of the photoresist layer 152, to leave smaller and thinner photoresist layers 152a, 152b. Consequently, portions of the top surfaces of the insulating layer 150a, 150b are exposed.

Figure 9C:
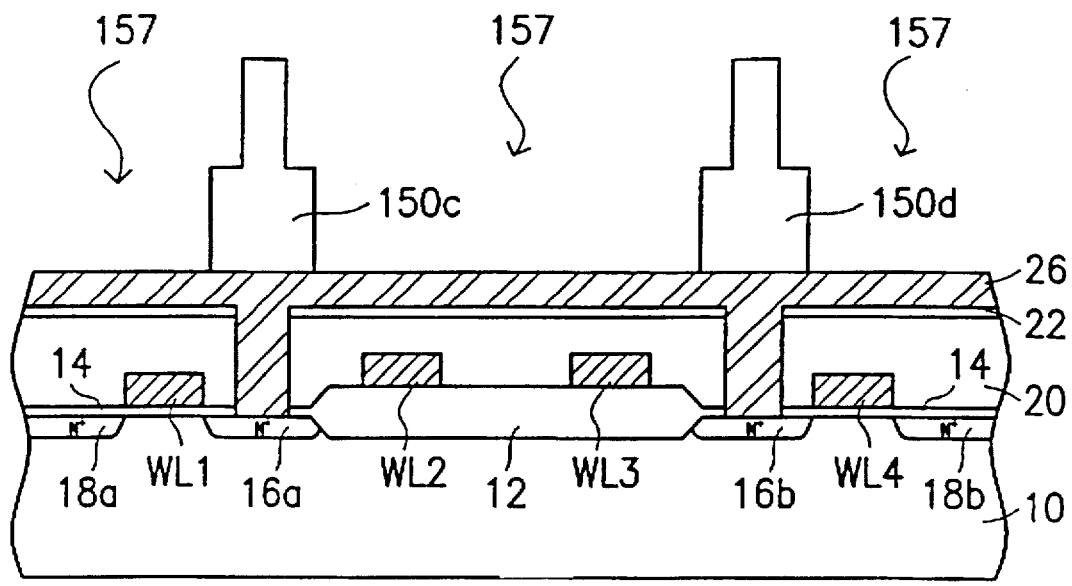

Referring to FIG. 9C, anisotropic etching is utilized to remove the exposed portions of the insulating layers 150a, 150b and the remaining exposed insulating layer until the polysilicon layer 26 is exposed. Thus, staircase-shaped insulating pillars 150c, 150d are formed. The photoresist layer is then removed.

Next, a method similar to the one used to fabricate the first preferred embodiment, which is described with reference to FIG. 2D to 2G, is performed to form the storage electrode according to the eighth preferred embodiment.

Figure 9D:
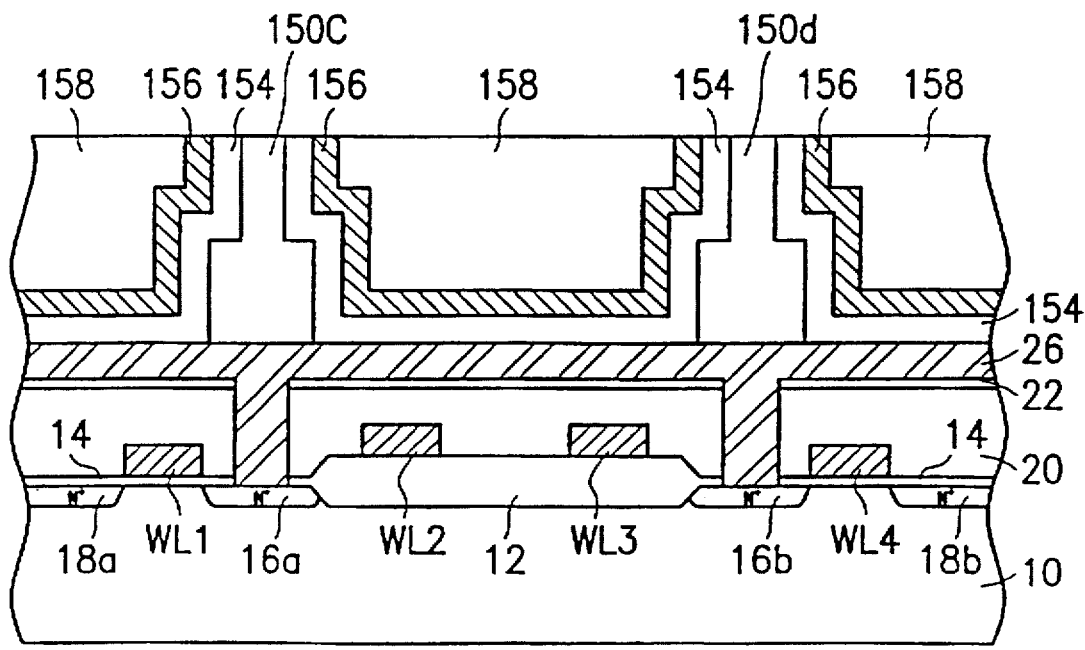

Referring to FIG. 9D, an insulating layer 154, a polysilicon layer 156, and a thick insulating layer 158 are then deposited in succession by CVD. Next, a CMP technique is used to polish the surface of the structure until the top surfaces of the insulating pillars 150c, 150d are exposed.

Figure 9E:
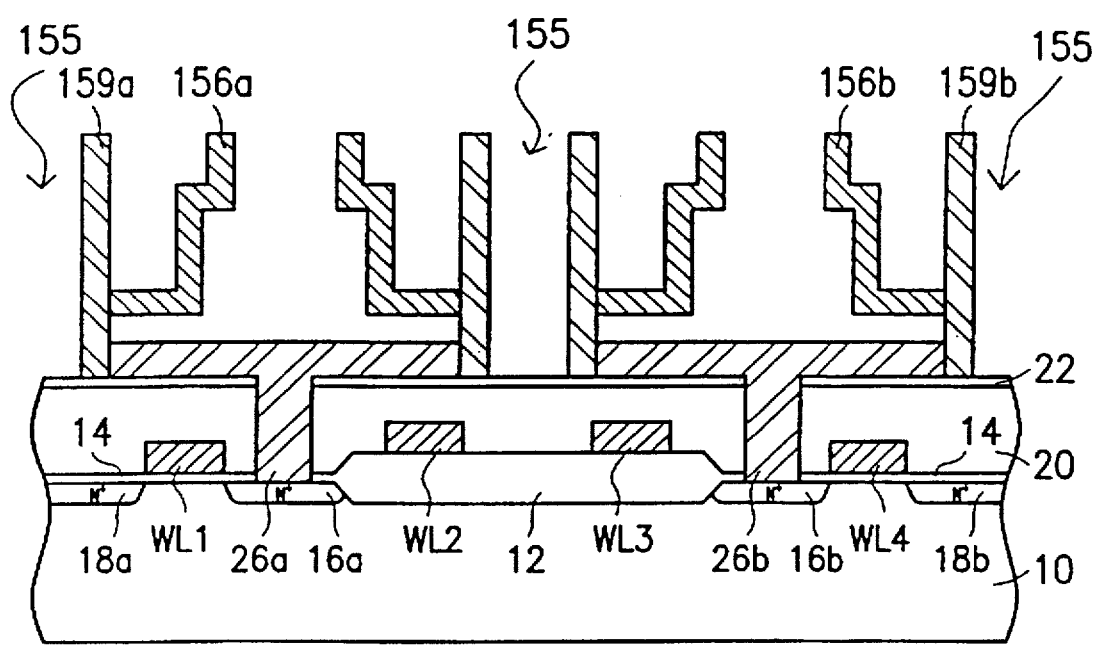

Referring to FIG. 9E, conventional photolithography and etching techniques are utilized to etch the insulating layer 158, the polysilicon layer 156, the insulating layer 154, and the polysilicon layer 26 in succession; thus, an opening 155 is formed and the storage electrode of the storage capacitor for each memory cell is patterned. Also by the above-mentioned etching step, the polysilicon layers 156 and 26 are divided into segments 156a, 156b and 26a, 26b, respectively. Then, polysilicon spacers 159a, 159b are formed on the sidewalls of the opening 155. Wet etching is performed by using the etching protection layer 22 as an etch end point to remove the exposed silicon dioxide layers, which are the insulating layers 158 and 154, and the insulating pillars 150c, 150d. After the wet etching step, the storage electrode of the DRAM storage capacitor is complete. The storage electrode includes, as shown in FIG. 9E, the lower trunk-like polysilicon layers 26a, 26b, the upper trunk-like polysilicon layers 159a, 159b, and the branch-like polysilicon layers 156a, 156b, which are folded structures with four segments substantially double L-shaped in cross section. The branch-like polysilicon layers 156a, 156b first connect to the inner surfaces of the upper trunk-like polysilicon layers 159a, 159b, extend inward horizontally for a determined distance, then again extend substantially upright for another determined distance, next extend inward horizontally for another determined distance, and then extend upright vertically.

According to this preferred embodiment, configurations of the insulating pillars and gapped insulating layer control the configuration and the angles of the branch-like polysilicon layer. Therefore, the configuration of insulating pillars and gapped insulating layers according to the invention is not limited to the particular disclosed embodiment. In fact, techniques to modify the disclosed configuration to result in a different final shape according to the eighth preferred embodiment are contemplated. For example, if isotropic etching or wet etching is utilized instead of anisotropic etching to etch the thick insulating layer, shown in FIG. 2C, the resulting insulating layer will be triangle-shaped. Alternatively, also as shown in FIG. 2C, after the insulating pillars 28a, 28b are formed, if insulating spacers are further formed on the sidewalls of the insulating pillars 28a, 28b, insulating pillars with different configurations will be obtained. Therefore, the branch-like polysilicon layer may be formed in several different configurations having various angles according the eighth preferred embodiment.

In accordance with the conception of the preferred embodiment, if branch-like polysilicon layers with more segments are desired, photoresist erosion and anisotropic etching of the gapped insulating layer can be performed once or more to form an insulating pillar with a multiple stair shape.

Ninth Preferred Embodiment

In the first through eighth preferred embodiments, a CMP technique is always utilized to remove the polysilicon layer from above the insulating pillars. However, the invention is not limited in scope by the use of this technique. In the ninth preferred embodiment, a conventional photolithography and etching technique is utilized to split the polysilicon layer on the insulating pillar. Therefore, a storage electrode with a different structure is formed.

A process for fabricating the ninth preferred embodiment of the invention, relating to a semiconductor memory device with a tree-type storage capacitor, is described in detail with reference to FIG. 10A through FIG. 10D.

The storage capacitor of the ninth embodiment is based on the wafer structure of FIG. 2C. A DRAM storage electrode with a different structure is fabricated by a further process. Elements in FIGS. 10A through 10D that are identical to those in FIG. 2C are labeled with the same reference numerals.

Figure 10A:
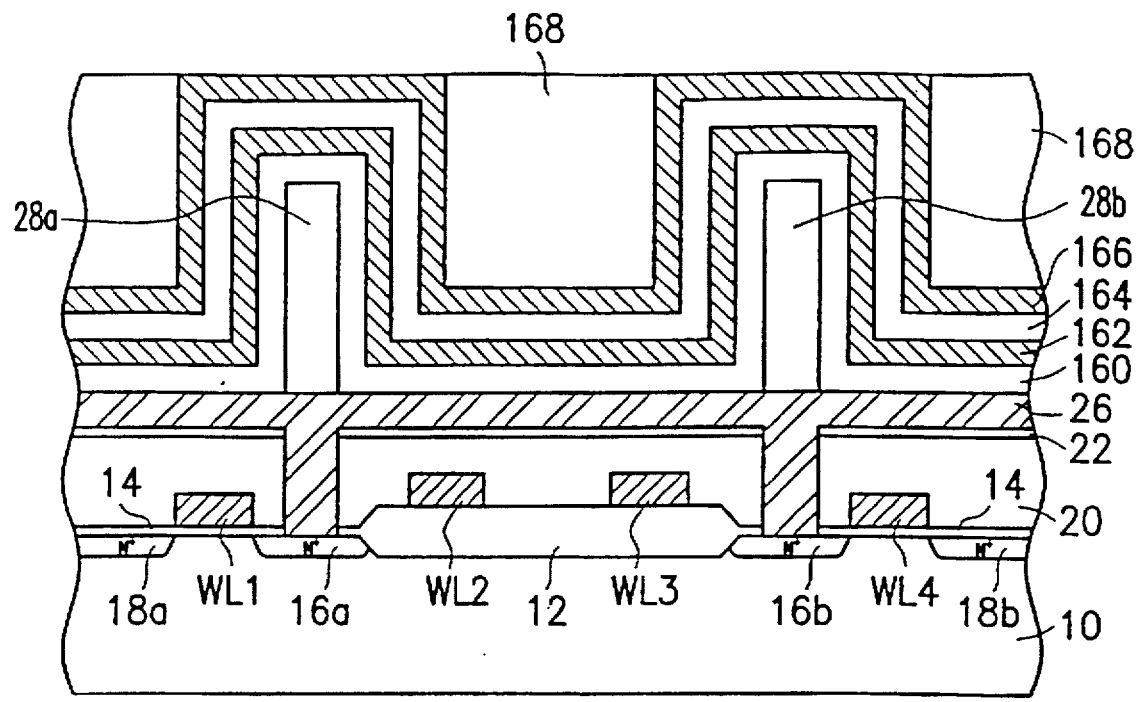
FIGS. 10A through 10D are cross-sectional views depicting process steps for fabricating a ninth embodiment of a semiconductor memory cell having a tree-type capacitor according to the invention.

Referring to FIGS. 10A and 2C, polysilicon layers and insulating layers are deposited alternately by CVD. As shown in FIG. 10A, an insulating layer 160, a polysilicon layer 162, an insulating layer 164, a polysilicon layer 166, and a thick insulating layer 168 are deposited over the silicon layer 26. The insulating layers 160, 164, 168 can be, for example, silicon dioxide layers. The thickness of the insulating layers 160, 164 and the polysilicon layers 162, 166 can be, for example, 1000 angstroms. The thick insulating layer 168 is preferably thick enough to fill the gap on the surface of the polysilicon layer 166.

Figure 10B:
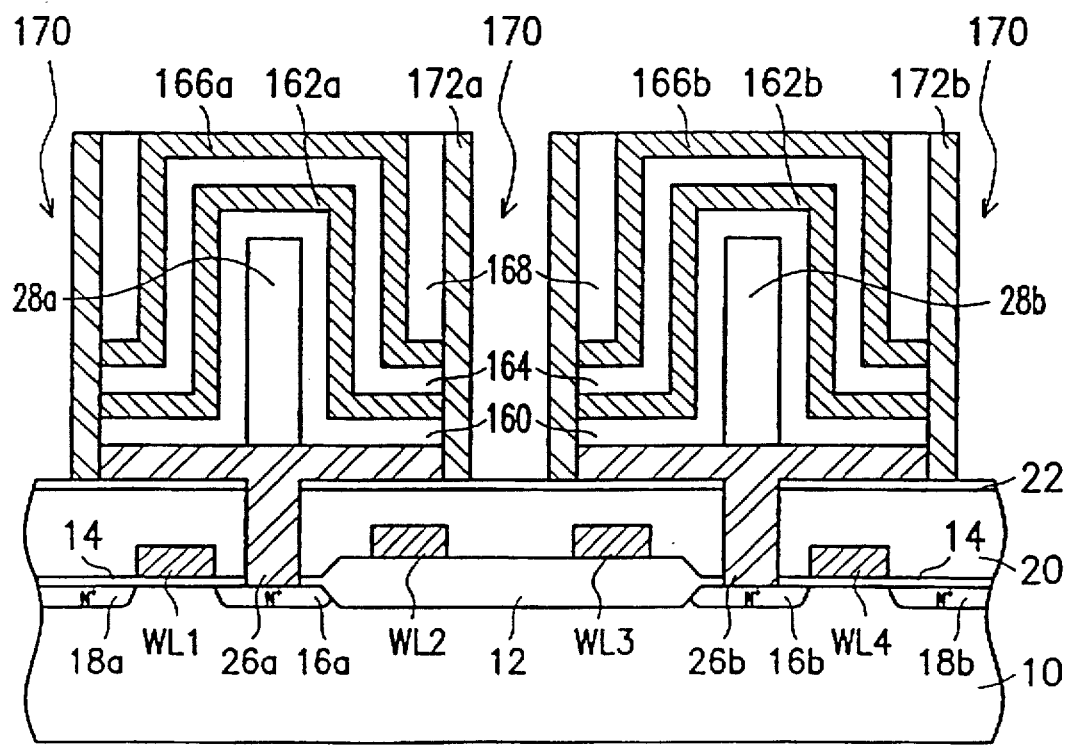

Referring to FIG. 10B, conventional photolithography and etching techniques are used to etch the insulating layer 168, the polysilicon layer 166, the insulating layer 164, the polysilicon layer 162, the insulating layer 160, and the polysilicon layer 26 in succession; thus, an opening 170 is formed and the storage electrode of the storage capacitor for each memory cell is patterned. Also by the above-mentioned etching step, the polysilicon layers 166, 162, and 26 are divided into segments 166a, 166b, 162a, 162b, and 26a, 26b, respectively. Then, polysilicon spacers 172a, 172b are formed on the sidewalls of the opening 170.

Figure 10C:
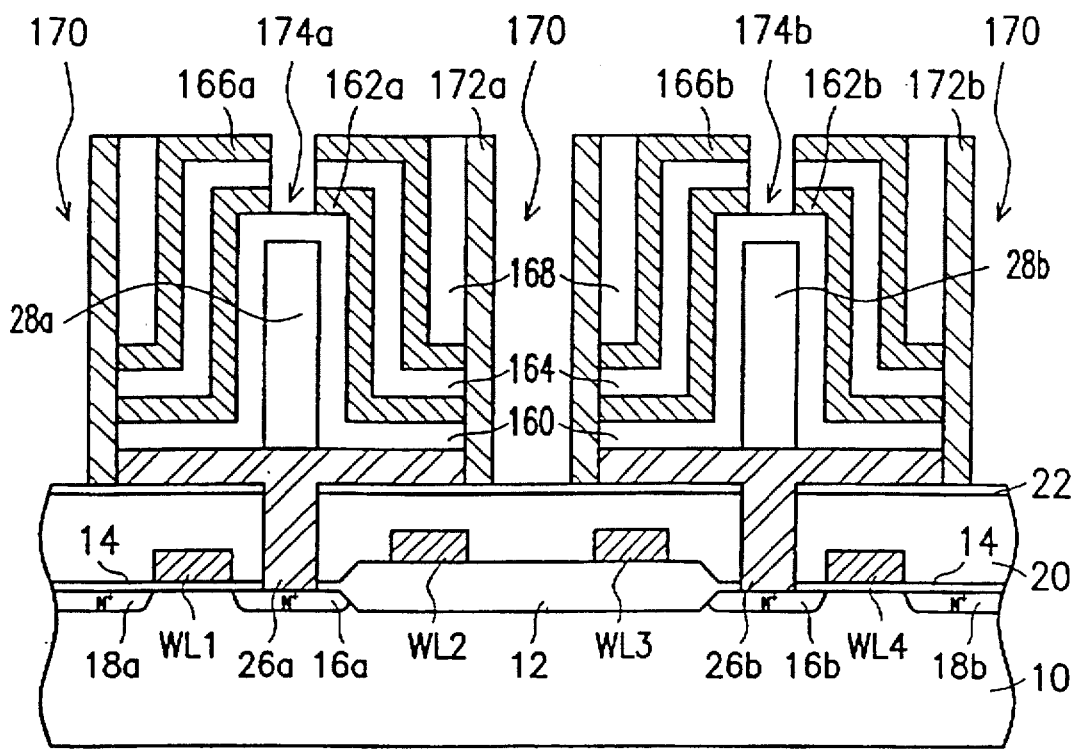

Referring to FIG. 10C, conventional photolithography and etching techniques are used to etch the polysilicon layers 166a, 166b, the insulating layers 164, and the polysilicon layers 162a, 162b in succession; therefore, openings 174a, 174b are formed. Consequently, the polysilicon layers 166a, 166b, and 162a, 162b on the insulating pillars 28a, 28b are partially etched to expose the silicon dioxide layers between the polysilicon layers.

Figure 10D:
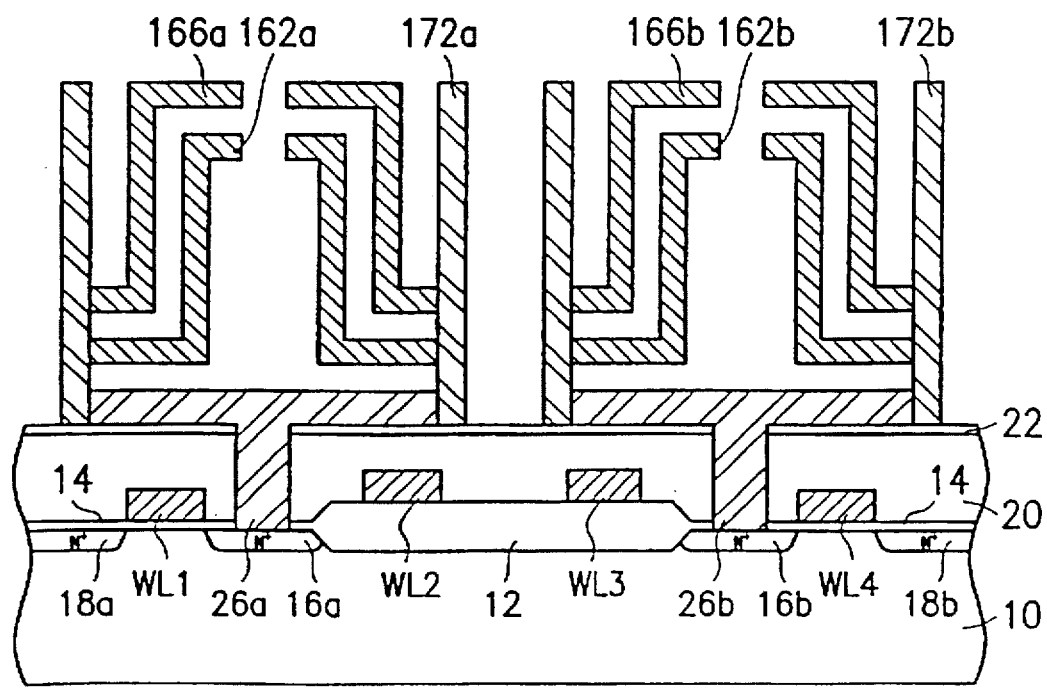

Referring to FIG. 10D, wet etching is performed by using the etching protection layer 22 as an etch end point to remove the exposed silicon dioxide layers, which are the insulating layers 168, 164, 160 and the insulating pillar 28a, 28b. After the wet etching step, the storage electrode of the DRAM storage capacitor is complete. The storage electrode shown in FIG. 10D includes the lower polysilicon layers 26a, 26b, the upper trunk-like polysilicon layers 172a, 172b, and the two layers of branch-like polysilicon 162a, 166a, 162b, 166b having three segments. The two layers of the branch-like polysilicon layers 162a, 166a, 162b, 166b first connect to the inner surface of the upper trunk-like polysilicon layers 172a, 172b, extend inward horizontally for a determined distance, then again extend upright approximately vertically for another determined distance, and then extend inward horizontally for another determined distance.

It is clear to one skilled in the art that the characteristics of the above-mentioned preferred embodiments can also be applied together in combination to form storage electrodes and storage capacitors having various structures. The structures of these storage electrodes and the storage capacitors are all within the scope of the invention.

Although in the accompanying drawings the embodiments of the drains of the transfer transistors are shown as diffusion areas in a silicon substrate, other variations, for example trench-type drain regions, are possible and are contemplated in accordance with the invention.

Elements in the accompanying drawings are schematic diagrams for demonstrative purposes and do not depict an actual scale of the invention. The dimensions of the elements of the invention as shown are not limitations on the scope of the invention.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a semiconductor memory device, wherein the semiconductor memory device includes a substrate, a transfer transistor formed on the substrate, and a storage capacitor electrically connected to a source/drain region of the transfer transistor, wherein the method comprises the steps of:

a. forming a first insulating layer over the substrate;

b. forming a first conductive layer over the first insulating layer and penetrating the first insulating layer to electrically connect to a source/drain region of the transfer transistor;

c. forming a pillar-shaped layer on the first conductive layer;

d. forming a second conductive layer over the pillar-shaped layer and the first conductive layer;

e. patterning the second conductive layer to remove a portion of the second conductive layer over the pillar-shaped layer;

f. patterning the second conductive layer and the first conductive layer to form an opening exposing a portion of the first insulating layer;

g. forming a third conductive layer shaped as a hollow cylinder connected to an edge of the first conductive layer at a periphery of the opening, wherein the third conductive layer and the first conductive layer form a trunk-like conductive layer, such that an end of the second conductive layer is connected to an inner surface of the third conductive layer to form a branch-like conductive layer, and wherein the first, second, and third conductive layers form a storage electrode of the storage capacitor;

h. removing the pillar-shaped layer;

i. forming a dielectric layer on an exposed surface of the first, second, and third conductive layers; and j. forming a fourth conductive layer on the dielectric layer to form an opposing electrode of the storage capacitor.

2. A method as claimed in claim 1, wherein the second conductive layer forms a branch-like conductive layer having an L-shaped cross section, wherein one end of the L-shaped cross section is connected to the inner surface of the third conductive layer.

3. A method as claimed in claim 1, wherein the trunk-like conductive layer includes:

a lower trunk-like portion electrically connected to the source/drain region of the transfer transistor, and having a T-shaped cross section; and an upper trunk-like portion extending substantially upright from an edge of the lower trunk-like portion.

4. A method as claimed in claim 1, wherein said step b includes forming the first conductive layer with a U-shaped cross section.

5. A method as claimed in claim 1, further including a step of forming an etching protection layer on the first insulating layer, to be performed after said step a and before said step b.

6. A method as claimed in claim 1, wherein said step e includes etching away the portion of the second conductive layer over the pillar-shaped layer.

7. A method as claimed in claim 1, wherein said step e includes polishing the portion of the second conductive layer over the pillar-shaped layer using a chemical mechanical polish technique.

8. A method as claimed in claim 1, further including a step of forming a second insulating layer on the surface of the pillar-shaped layer and the first conductive layer, to be performed after said step c and before said step d, and wherein said step h further includes a step of removing the second insulating layer.

9. A method as claimed in claim 1, further including a step of forming a third insulating layer on the second conductive layer, to be performed between said step d and said step e, the third insulating layer substantially completely filling the gap in the second conductive layer, and wherein said step h further includes a step of removing the third insulating layer.

10. A method as claimed in claim 1, wherein said step c includes the steps of:

forming a thick insulating layer on the first conductive layer;

forming a photoresist layer covering the thick insulating layer over the source/drain region;

etching a portion of the uncovered thick insulating layer;

performing photoresist erosion to expose a portion of the unetched thick insulating layer;

etching the exposed thick insulating layer to form a pillar-shaped layer with a staircase shape; and removing the photoresist.

11. A method as claimed in claim 1, further including the steps of:

forming an etching protection layer on the first insulating layer after said step a; and forming a fourth insulating layer on the etching protection layer before said step b;

wherein said step b further includes a step of forming the first conductive layer over the fourth insulating layer and penetrating the fourth insulating layer and the etching protection layer, and wherein said step h further includes a step of removing the fourth insulating layer.

12. A method of fabricating a semiconductor memory device, wherein the semiconductor memory device includes a substrate, a transfer transistor formed on the substrate, and a storage capacitor electrically connected to a source/drain region of the transfer transistor, wherein the method comprises the steps of:

a. forming a first insulating layer over the substrate;

b. forming a first conductive layer over the first insulating layer and penetrating the first insulating layer to electrically connect to a source/drain region of the transfer transistor;

c. forming a pillar-shaped layer on the first conductive layer;

d. forming a first film and then a second film on the surfaces of the pillar-shaped layer and the first conductive layer, wherein the second film is made of a conductive material, and the first film is made of an insulating material;

e. patterning the second film to remove a portion of the second film over the pillar-shaped layer;

f. patterning the second film, the first film, and the first conductive layer to form an opening exposing a portion of the first insulating layer, wherein the first conductive layer has an edge at a periphery of the opening;

g. forming a second conductive layer shaped as a hollow cylinder connected to the edge of the first conductive layer, wherein the second conductive layer and the first conductive layer form a trunk-like conductive layer, such that an end of the second film is connected to an inner surface of the second conductive layer to form a branch-like conductive layer, and wherein the first conductive layer, the second film, and the second conductive layer form a storage electrode of the storage capacitor;

h. removing the pillar-shaped layer and the first film;

i. forming a dielectric layer on exposed surfaces of the first conductive layer, the second film, and the second conductive layer; and j. forming a third conductive layer on the dielectric layer to form an opposing electrode of the storage capacitor on a surface of the dielectric layer.

13. A method as claimed in claim 12, wherein the second film forms a branch-like conductive layer having an L-shaped cross section, wherein one end of the L-shaped cross section is connected to the inner surface of the second conductive layer.

14. A method as claimed in claim 12, wherein the trunk-like conductive layer includes:

a lower trunk-like portion electrically connected to the source/drain region of the transfer transistor, and having a T-shaped cross section; and an upper trunk-like portion extending substantially upright from an edge of the lower trunk-like portion.

15. A method as claimed in claim 12, wherein said step b includes forming the first conductive layer with a U-shaped cross section.

16. A method as claimed in claim 12, further comprising a step of forming an etching protection layer on the first insulating layer, to be performed after said step a and before said step b.

17. A method as claimed in claim 12, wherein said step e includes etching away the portion of the second film over the pillar-shaped layer.

18. A method as claimed in claim 12, wherein said step e includes polishing the second film over the pillar-shaped layer using a chemical mechanical polish technique.

19. A method as claimed in claim 12, wherein the second film includes raised structures with a gap therebetween, and further including a step of forming a second insulating layer on the second film, to be performed after said step d and before said step e, the second insulating layer substantially completely filling the gap in the second film, and wherein said step h further includes a step of removing the second insulating layer.

20. A method as claimed in claim 12, wherein said step c includes the steps of:

forming a thick insulating layer on the first conductive layer;

forming a photoresist layer covering the thick insulating layer over the source/drain region;

etching a portion of the uncovered thick insulating layer;

performing photoresist erosion to expose a portion of the unetched thick insulating layer;

etching the exposed thick insulating layer until the first conductive layer is exposed, to form a pillar-shaped layer with a staircase shape; and removing the photoresist.

21. A method as claimed in claim 12, further including the steps of:

forming an etching protection layer on the first insulating layer after said step a; and forming a third insulating layer on the etching protection layer before said step b;

wherein said step b further includes a step of forming the first conductive layer over the third insulating layer and penetrating the third insulating layer and the etching protection layer, and wherein said step h further includes a step of removing the third insulating layer.

22. A method as claimed in claim 12, wherein:
said step d further includes the steps of:
forming a third film and then a fourth film on the second film, wherein the third film is made of an insulating material and the fourth film is made of a conductive material; and
forming a second insulating layer on the fourth film, wherein the fourth film includes raised structures with a gap therebetween and the second insulating layer substantially completely fills the gap;
said step e further includes the step of:
patterning the fourth film, the third film, the second film, and the first film to remove portions of the fourth film, the third film, the second film, and the first film over the pillar-shaped layer, wherein the width of each said portion is about the same as the width of the pillar-shaped layer and said portions are removed by a photolithography and etching technique;
said step f further includes the step of:
patterning the fourth film and the third film to form the opening;
in said step g, the second conductive layer is formed such that an end of the fourth film is connected to the inner surface of the second conductive layer;
wherein the first conductive layer, the second film, the fourth film, and the second conductive layer form the storage electrode;
said step h further includes the step of removing the third film; and
in said step i, the dielectric layer is further formed on the exposed surface of the fourth film.

23. A method of fabricating a semiconductor memory device, wherein the semiconductor memory device includes a substrate, a transfer transistor formed on the substrate, and a storage capacitor electrically connected to a source/drain region of the transfer transistor, wherein the method comprises:
a. forming a first insulating layer over the substrate;
b. forming a first conductive layer over the first insulating layer and penetrating the first insulating layer to electrically connect to the source/drain region of the transfer transistor, wherein the first conductive layer has an edge;
c. forming an insulating pillar-shaped layer on the first conductive layer;
d. forming a second conductive layer on sidewalls of the insulating pillar-shaped layer, so as to surround the insulating pillar-shaped layer;
e. patterning the first conductive layer to form an opening exposing a portion of the first insulating layer, the first conductive layer having an edge at a periphery of the opening;
f. forming a third conductive layer shaped as a hollow cylinder connected to the edge of the first conductive layer, wherein the second conductive layer forms a branch-like conductive layer, and wherein the first, second, and third conductive layers form a storage electrode of the storage capacitor;
h. removing the insulating pillar-shaped layer;
i. forming a dielectric layer on exposed surfaces of the first, second, and third conductive layers; and j. forming a fourth conductive layer on the dielectric layer to form an opposing electrode of the storage capacitor.

24. A method as claimed in claim 23, wherein the second conductive layer forms a branch-like conductive layer having a pillar-shaped cross section, wherein an end of the branch-like conductive layer is connected to an upper surface of the first conductive layer.

25. A method as claimed in claim 23, wherein the first conductive layer has a T-shaped cross section.

26. A method as claimed in claim 23, wherein the first conductive layer has a U-shaped cross section.

27. A method as claimed in claim 23, further comprising forming an etching protection layer on the first insulating layer, after said forming a first insulating layer and before said forming a first conductive layer.

28. A method as claimed in claim 23, further including:
forming an etching protection layer on the first insulating layer after said forming a first insulating layer; and
forming a third insulating layer on the etching protection layer before said forming a first conductive layer;
wherein said forming a first conductive layer further includes forming the first conductive layer over the third insulating layer and penetrating the third insulating layer and the etching protection layer; and wherein said removing the insulating pillar-shaped layer further includes removing the third insulating layer.

29. A method as claimed in claim 23, wherein a horizontal cross section of the second conductive layer is circular.

30. A method as claimed in claim 23, wherein a horizontal cross section of the second conductive layer is rectangular.

31. A method of fabricating a semiconductor memory device, wherein the semiconductor memory device includes a substrate, a transfer transistor formed on the substrate, and a storage capacitor electrically connected to a source/drain region of the transfer transistor, wherein the method comprises:
a. forming a first insulating layer over the substrate;
b. forming a first conductive layer over the first insulating layer and penetrating the first insulating layer to electrically connect to the source/drain region of the transfer transistor, wherein the first conductive layer has an edge;
c. forming a pillar-shaped layer on the first conductive layer, including:
forming a thick insulating layer on the first conductive layer;
forming a photoresist layer covering the thick insulating layer over the source/drain region;
etching the thick insulating layer;
performing a photoresist erosion to expose a portion of the unetched thick insulating layer;
etching the exposed thick insulating layer until the first conductive layer is exposed, to form a pillar-shaped layer with a staircase shape; and
removing the photoresist;
d. forming a second conductive layer on sidewalls of the pillar-shaped;
e. patterning the first conductive layer to form an opening exposing a portion of the first insulating layer, the first conductive layer having an edge at a periphery of the opening;
f. forming a third conductive layer shaped as a hollow cylinder connected to the edge of the first conductive layer, wherein the second conductive layer forms a branch-like conductive layer, and wherein the first, second, and third conductive layers form a storage electrode of the storage capacitor;

h. removing the pillar-shaped layer;

i. forming a dielectric layer on exposed surfaces of the first, second, and third conductive layers; and j. forming a fourth conductive layer on the dielectric layer to form an opposing electrode of the storage capacitor.

32. A method of fabricating a semiconductor memory device, wherein the semiconductor memory device includes a substrate, a transfer transistor formed on the substrate, and a storage capacitor electrically connected to a source/drain region of the transfer transistor, wherein the method comprises the steps of:

a. forming a first insulating layer over the substrate;

b. forming a first conductive layer over the first insulating layer and penetrating the first insulating layer to electrically connect to the source/drain region of the transfer transistor;

c. forming a pillar-shaped layer having sidewalls, on the first conductive layer;

d. forming a second conductive layer on the sidewalls of the pillar-shaped layer, wherein an end of the second conductive layer is connected to an upper surface of the first conductive layer;

e. forming a first film and then a second film on the second conductive layer, the pillar-shaped layer, and the first conductive layer, wherein the second film is made of a conductive material and the first film is made of an insulating material;

f. removing a portion of the second film over the pillar-shaped layer;

g. patterning the second film, the first film, and the first conductive layer to form an opening exposing a portion of the first insulating layer;

h. forming a third conductive layer shaped as a hollow cylinder connected to an edge of the first conductive layer at a periphery of the opening, wherein the third conductive layer and the first conductive layer form a trunk-like conductive layer, such that an end of the second film is connected to an inner surface of the third conductive layer, wherein the second film and the second conductive layer form a branch-like conductive layer, and wherein the first, second, and third conductive layers and the second film form a storage electrode of the storage capacitor;

i. removing the pillar-shaped layer and the first film;

j. forming a dielectric layer on exposed surfaces of the first, second, and third conductive layers; and k. forming a fourth conductive layer on the dielectric layer to form an opposing electrode of the storage capacitor.

33. A method as claimed in claim 32, wherein the second conductive layer forms a pillar-shaped portion of the branch-like conductive layer, wherein one end of the pillar-shaped portion is connected to an upper surface of the first conductive layer, wherein the second film forms an L-shaped portion of the branch-like conductive layer, and wherein one end of the L-shaped portion is connected to the inner surface of the third conductive layer.

34. A method as claimed in claim 32, wherein the first conductive layer has a T-shaped cross section.

35. A method as claimed in claim 32, wherein the first conductive layer has a U-shaped cross section.

36. A method as claimed in claim 32 further comprising a step of forming an etching protection layer on the first insulating layer, after said step a and before said step b.

37. A method as claimed in claim 32, wherein the second film includes raised structures with a gap therebetween, and further including a step of forming a second insulating layer on the second film, to be performed between said step e and said step f, the second insulating layer substantially completely filling the gap in the second film, and wherein said step i further includes a step of removing the second insulating layer.

38. A method as claimed in claim 32, wherein said step c includes the steps of:

forming a thick insulating layer on the first conductive layer;

forming a photoresist layer covering the thick insulating layer over the source/drain region;

etching a portion of the uncovered thick insulating layer;

performing photoresist erosion to expose a portion of the unetched thick insulating layer;

etching the exposed thick insulating layer until the first conductive layer is exposed, to form a pillar-shaped layer with a staircase shape; and removing the photoresist.

39. A method as claimed in claim 32, further including the steps of:

forming an etching protection layer on the first insulating layer after said step a; and forming a third insulating layer on the etching protection layer before said step b;

wherein said step b further includes a step of forming the first conductive layer over the third insulating layer and penetrating the third insulating layer and the etching protection layer, and wherein said step i further includes a step of removing the third insulating layer.

40. A method as claimed in claim 32, wherein a horizontal cross section of the second conductive layer is circular.

41. A method as claimed in claim 32, wherein a horizontal cross section of the second conductive layer is rectangular.

42. A method as claimed in claim 32, wherein a horizontal cross section of the third conductive layer is circular.

43. A method as claimed in claim 32, wherein a horizontal cross section of the third conductive layer is rectangular.

44. A method as claimed in claim 32, wherein said step f includes etching away a portion of the second film over the pillar-shaped layer.

45. A method as claimed in claim 32, wherein said step f includes polishing the second film over the pillar-shaped layer using a chemical mechanical polish technique.

46. A method of fabricating a semiconductor memory device, wherein the semiconductor memory device includes a substrate, a transfer transistor formed on the substrate, and a storage capacitor electrically connected to a source/drain region of the transfer transistor, wherein the method comprises:

a. forming a first insulating layer over the substrate;

b. forming a trunk-like conductive layer, including a lower trunk-like portion electrically connected to the source/drain region, and an upper trunk-like portion extending substantially upright from a horizontally peripheral edge of the lower trunk-like portion;

c. forming a branch-like conductive layer, including a first extended segment and a second extended segment, wherein a first end of the first extended segment is connected to an inner surface of the upper trunk-like portion, and wherein the second extended segment extends from a second end of the first extended segment, the trunk-like conductive layer and the branch-like conductive layer forming a storage electrode of the storage capacitor, said step c including:

forming an insulating, pillar-shaped layer standing upright on a horizontal upper surface of the lower trunk-like layer and a second insulating layer having a horizontal portion on the horizontal upper surface, and a vertical portion along sidewalls of the pillar-shaped layer forming the first extended segment of the branch-like conductive layer on the horizontal portion of the second insulating layer and forming the second extended portion along vertical peripheries of the vertical portion of the second insulating layer;

d. forming a dielectric layer on the trunk-like conductive layer and the branch-like conductive layer; and e. forming an upper conductive layer on the dielectric layer to form an opposing electrode of the storage capacitor.

47. A method of fabricating a semiconductor memory device, wherein the semiconductor memory device includes a substrate, a transfer transistor formed on the substrate, and a storage capacitor electrically connected to a source/drain region of the transfer transistor, wherein the method comprises:

a. forming an insulating layer over the substrate;

b. forming a trunk-like conductive layer, including a lower trunk-like portion electrically connected to the source/drain region, and an upper trunk-like portion extending substantially upright from a horizontally peripheral edge of the lower trunk-like portion;

c. forming a branch-like conductive layer, having a substantially hollow cylindrical shape, wherein an end of the branch-like conductive layer is connected to an upper surface of the upper trunk-like portion and extends substantially upright;

d. forming a second branch-like conductive layer, wherein an end of the second branch-like conductive layer is connected to an inner surface of the upper trunk-like portion, wherein the second branch-like conductive layer has an outwardly extended portion extending outwardly from the end, and wherein the trunk-like conductive layer and the branch-like conductive layer form a storage electrode of the storage capacitor;

e. forming a dielectric layer on exposed surfaces of the trunk-like conductive layer and the branch-like conductive layer; and f. forming an upper conductive layer on the dielectric layer to form an opposing electrode of the storage capacitor.

* * * * *